United States Patent

Orita et al.

[11] Patent Number: 6,028,573
[45] Date of Patent: Feb. 22, 2000

[54] DRIVING METHOD AND APPARATUS FOR DISPLAY DEVICE

[75] Inventors: Isamu Orita; Akihiko Kougami, both of Kokubunji; Shigeo Mikoshiba, Tokyo; Takeaki Okabe, Tokyo; Kouzou Sakamoto, Tokyo; Masahiro Eto, Fujisawa, all of Japan

[73] Assignee: Hitachi, Ltd., Tokyo, Japan

[21] Appl. No.: 08/715,166

[22] Filed: Sep. 17, 1996

Related U.S. Application Data

[63] Continuation-in-part of application No. 08/006,718, Jan. 2, 1992, which is a continuation of application No. 07/398,857, Aug. 25, 1989.

[30] Foreign Application Priority Data

Aug. 29, 1988 [JP] Japan .................................. 63-212465
Sep. 29, 1988 [JP] Japan .................................. 63-245446

[51] Int. Cl.[7] .............................. G09G 3/28; G09G 3/22; G09G 3/30
[52] U.S. Cl. ................................. 345/66; 345/60; 345/75; 345/76
[58] Field of Search ...................... 345/60–86, 204–208; 315/241 R

[56] References Cited

U.S. PATENT DOCUMENTS

| | | | |
|---|---|---|---|
| 4,384,287 | 5/1983 | Sakuma | 345/60 |
| 4,636,789 | 1/1987 | Yamaguchi et al. | 345/76 |
| 4,707,692 | 11/1987 | Higgins et al. | 345/204 |
| 4,864,182 | 9/1989 | Fujioka et al. | 345/76 |
| 4,866,349 | 9/1989 | Weber et al. | 345/68 |
| 4,888,523 | 12/1989 | Shoji et al. | 345/79 |
| 5,027,040 | 6/1991 | Ikeda et al. | 315/241 R |
| 5,081,400 | 1/1992 | Weber et al. | 345/208 |

*Primary Examiner*—Jeffrey Brier
*Assistant Examiner*—David L Lewis
*Attorney, Agent, or Firm*—Pennie & Edmonds LLP

[57] ABSTRACT

In a method for driving a display device, by which energy stored in a plurality of electrodes serving as a capacitive load is recovered through switches, current paths for charging said electrodes from a charge supplying source differ from current paths for discharging the electrodes for the energy recovery.

25 Claims, 26 Drawing Sheets

FIG. 1
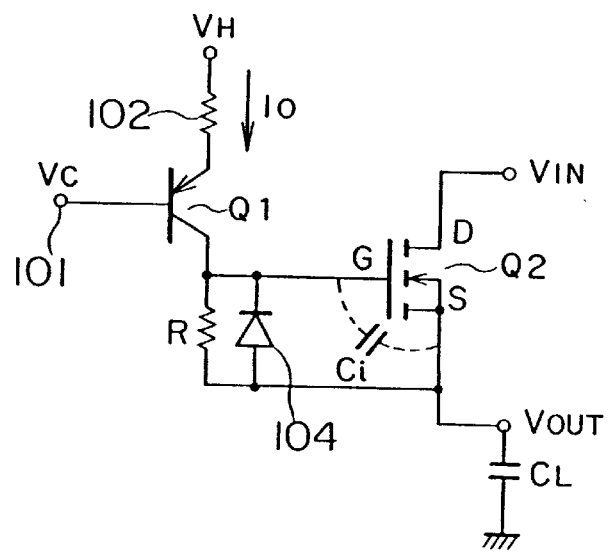
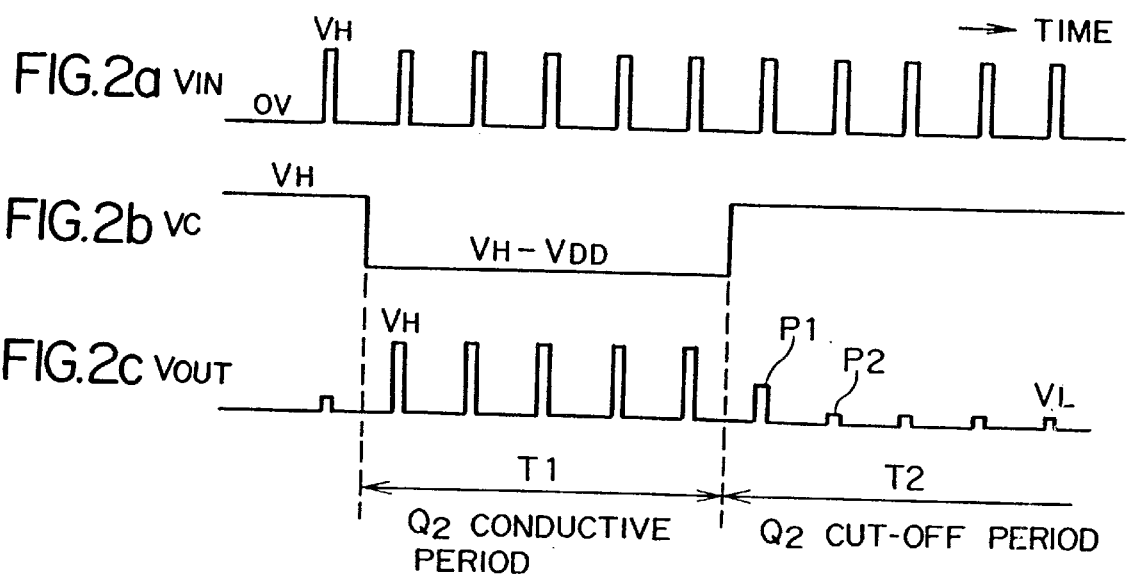

FIG. 3
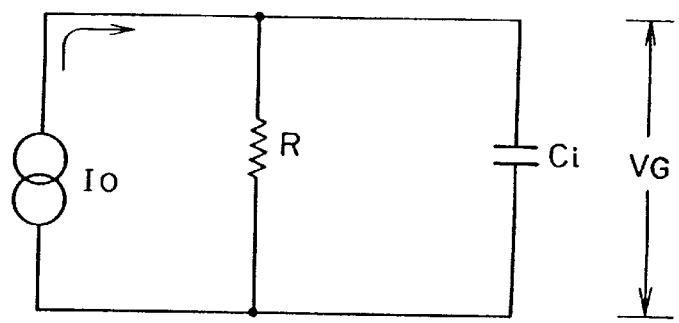
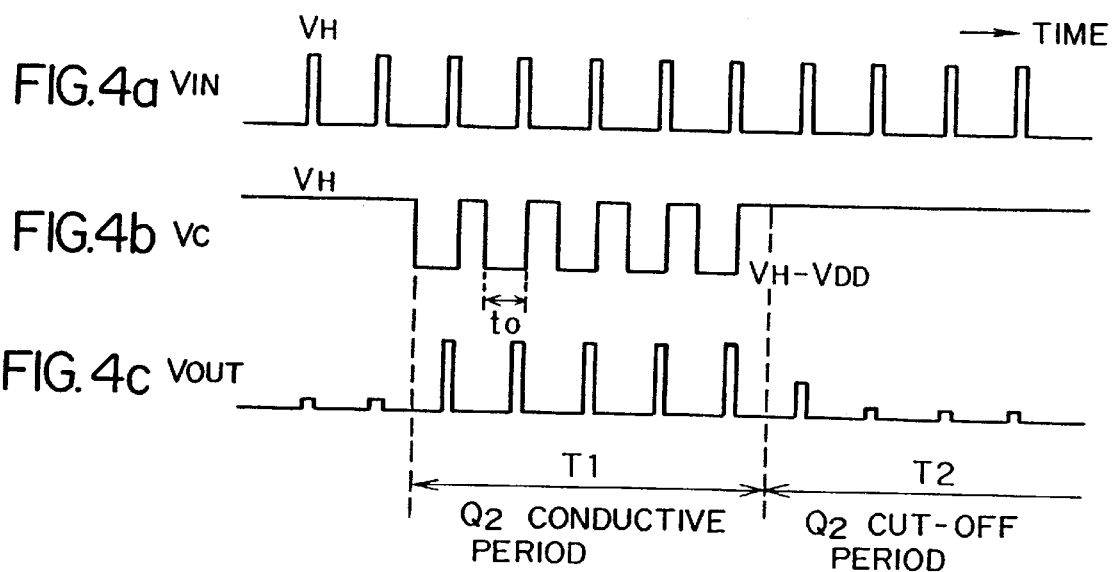

FIG. 5
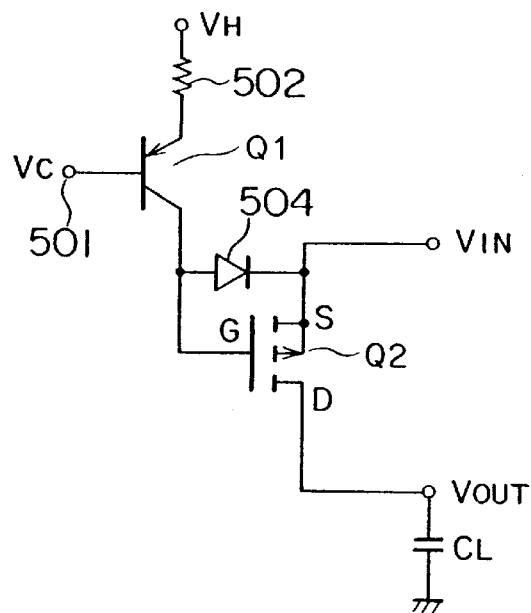
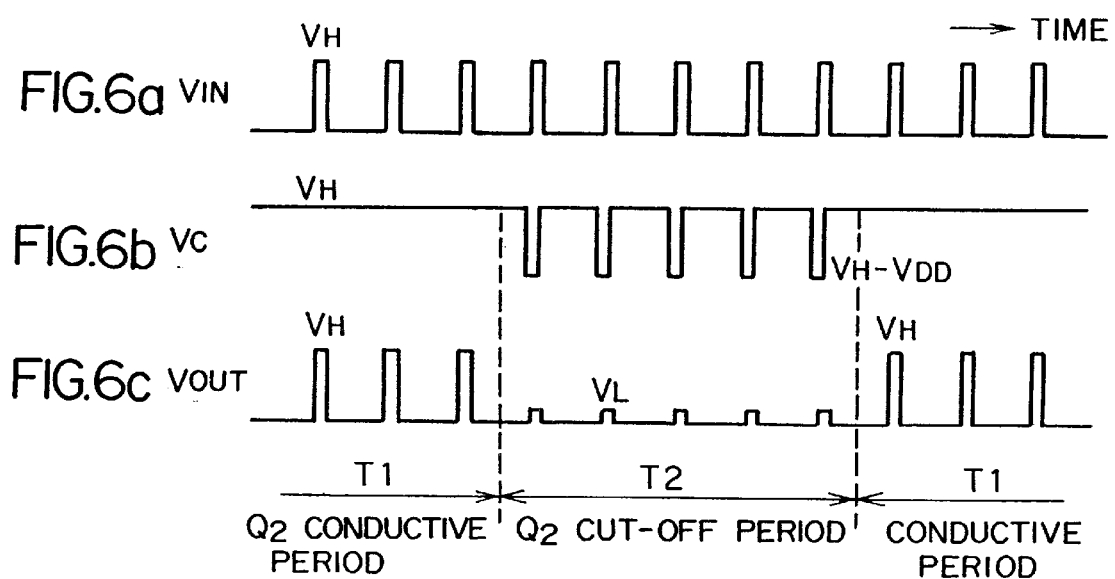

FIG. 7
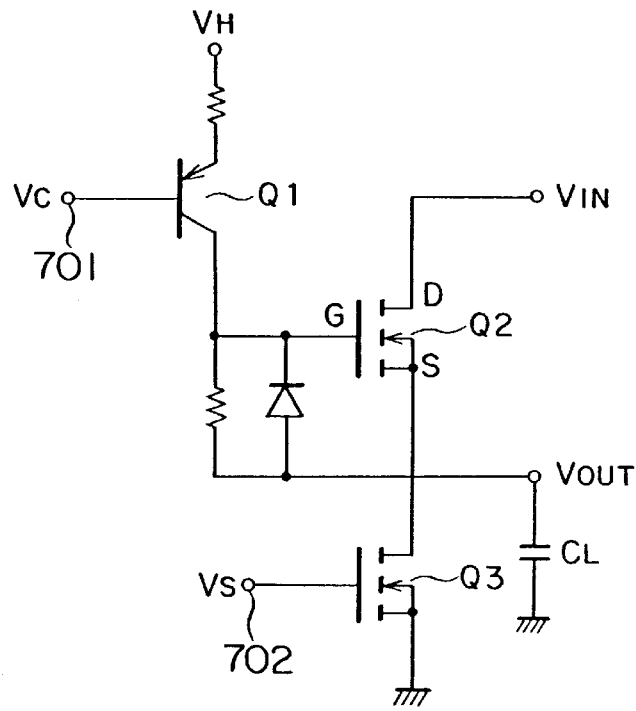
FIG. 8a V$_{IN}$
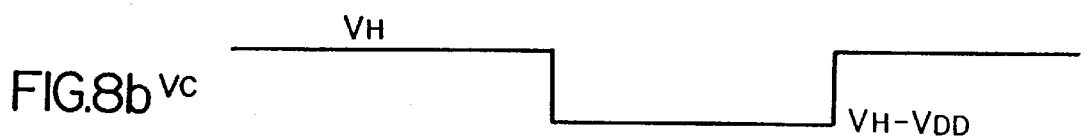
FIG. 8b V$_C$
FIG. 8c V$_S$
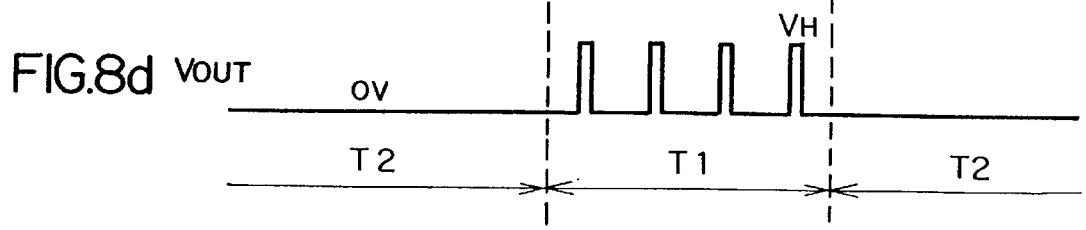
FIG. 8d V$_{OUT}$ FIG. 11
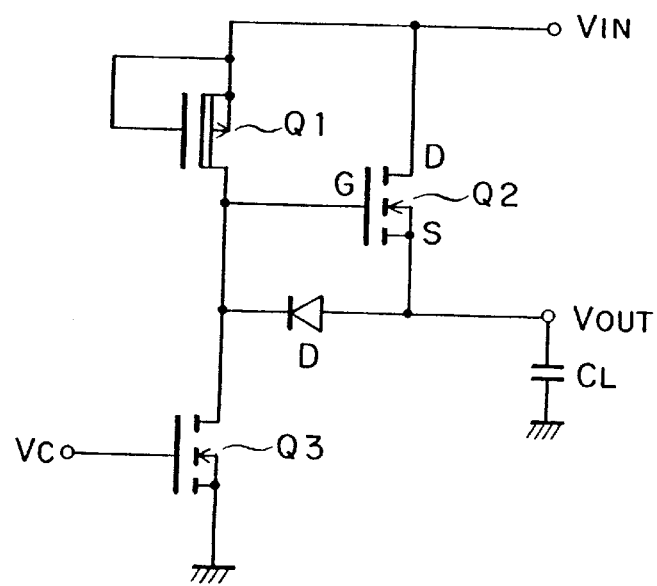
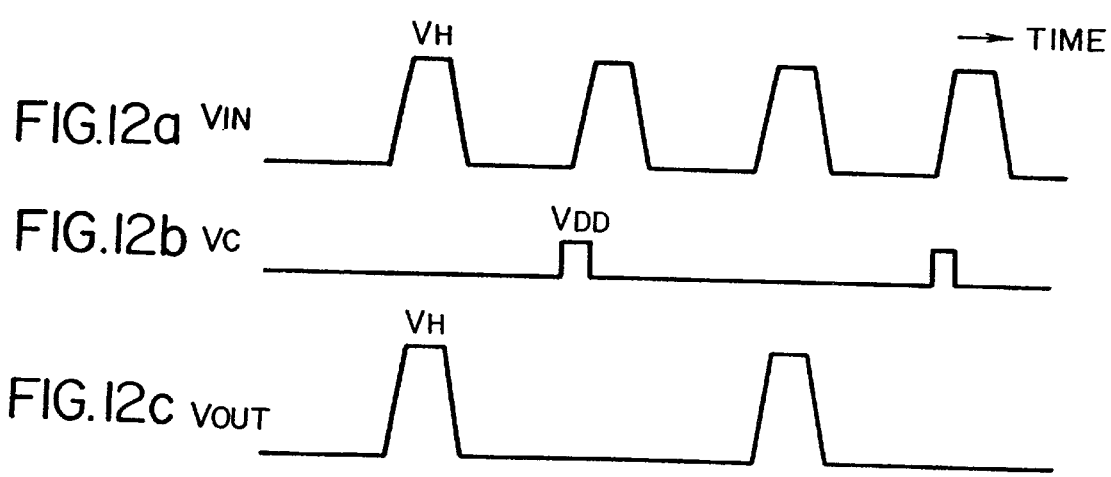
FIG.12a V$_{IN}$
FIG.12b V$_C$
FIG.12c V$_{OUT}$ FIG. 20
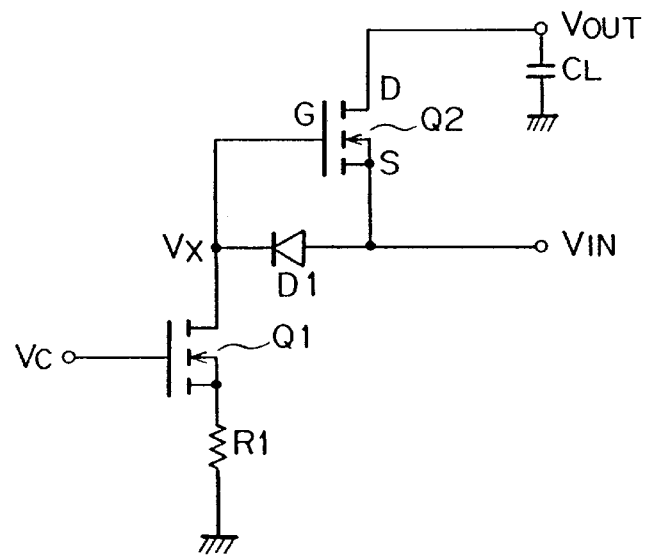
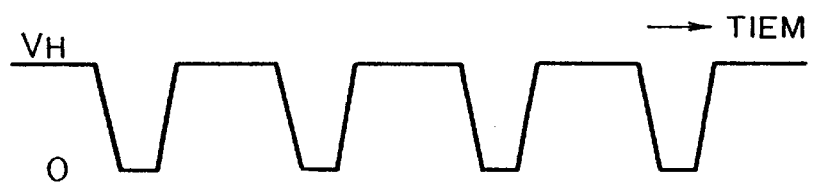
FIG.21a V_IN
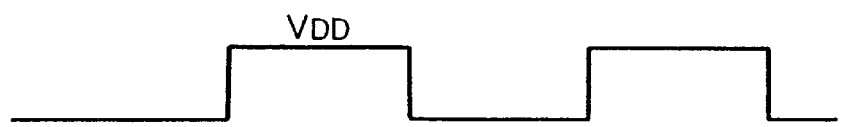
FIG.21b V_C
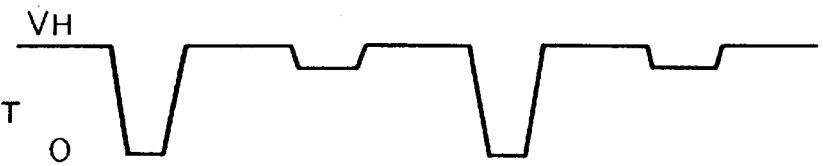
FIG.21c V_OUT

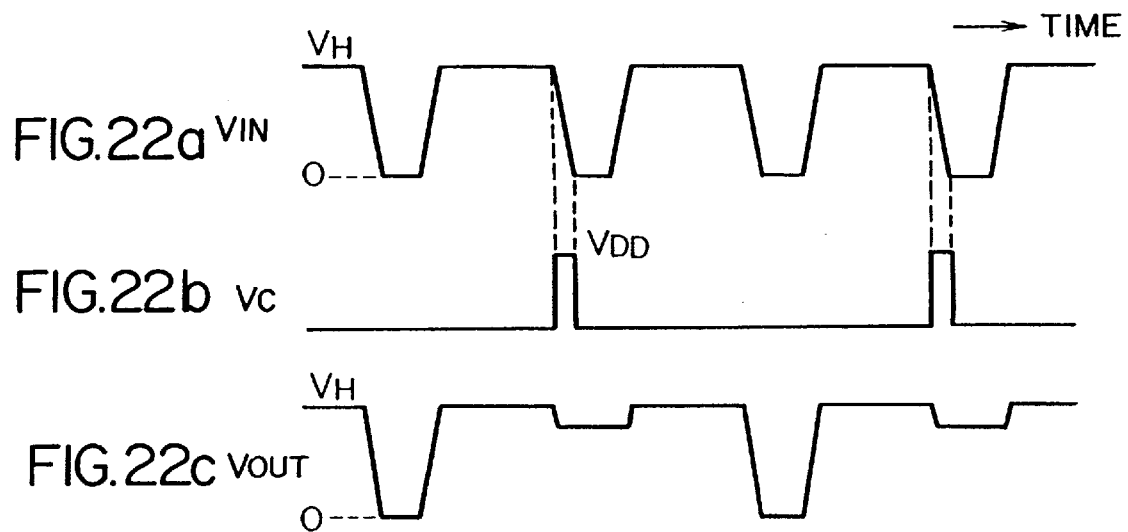
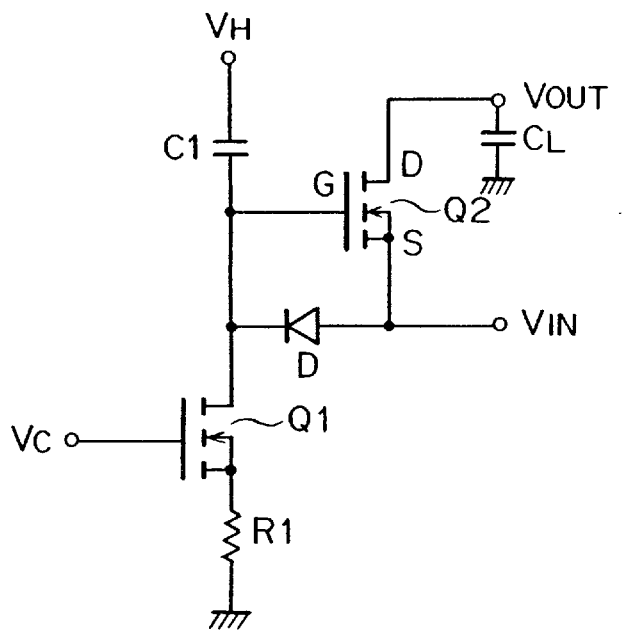
FIG. 23

| VCON | VIN | VOUT |
|------|-----|------|
| H | L | L |
| H | H | H |
| L | L | HOLD |
| L | H | H |

| VCON | VIN | VOUT |
|------|-----|------|
| H | L | L |
| H | H | H |
| L | L | H |
| L | H | H |

FIG. 33
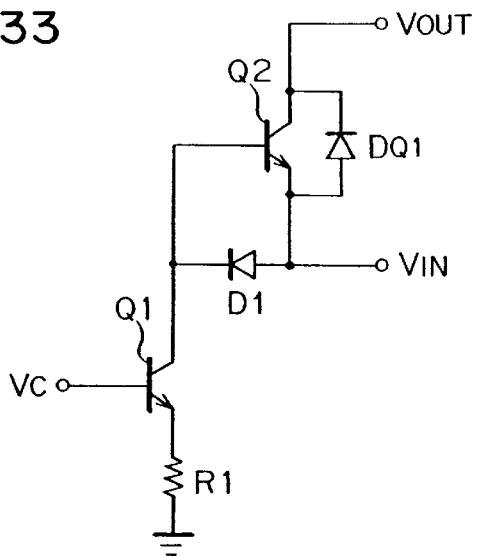
FIG. 34
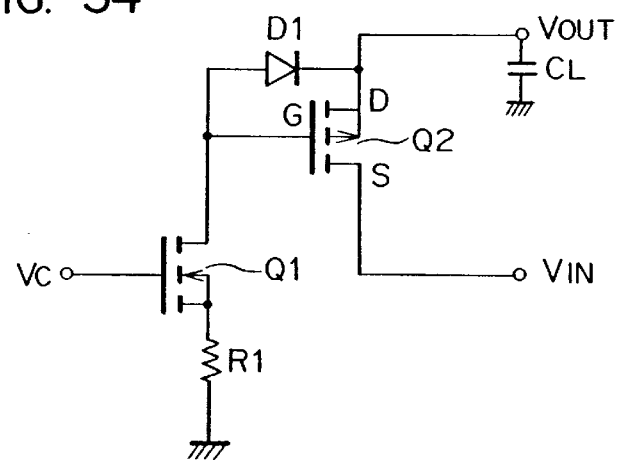
FIG. 35a V$_{IN}$
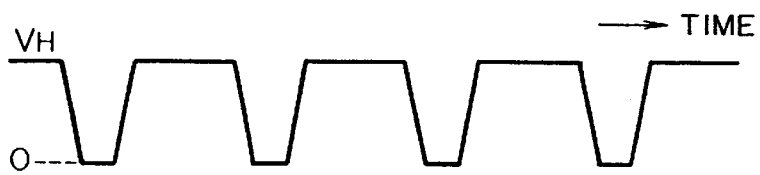
FIG. 35b V$_C$
FIG. 35c V$_{OUT}$

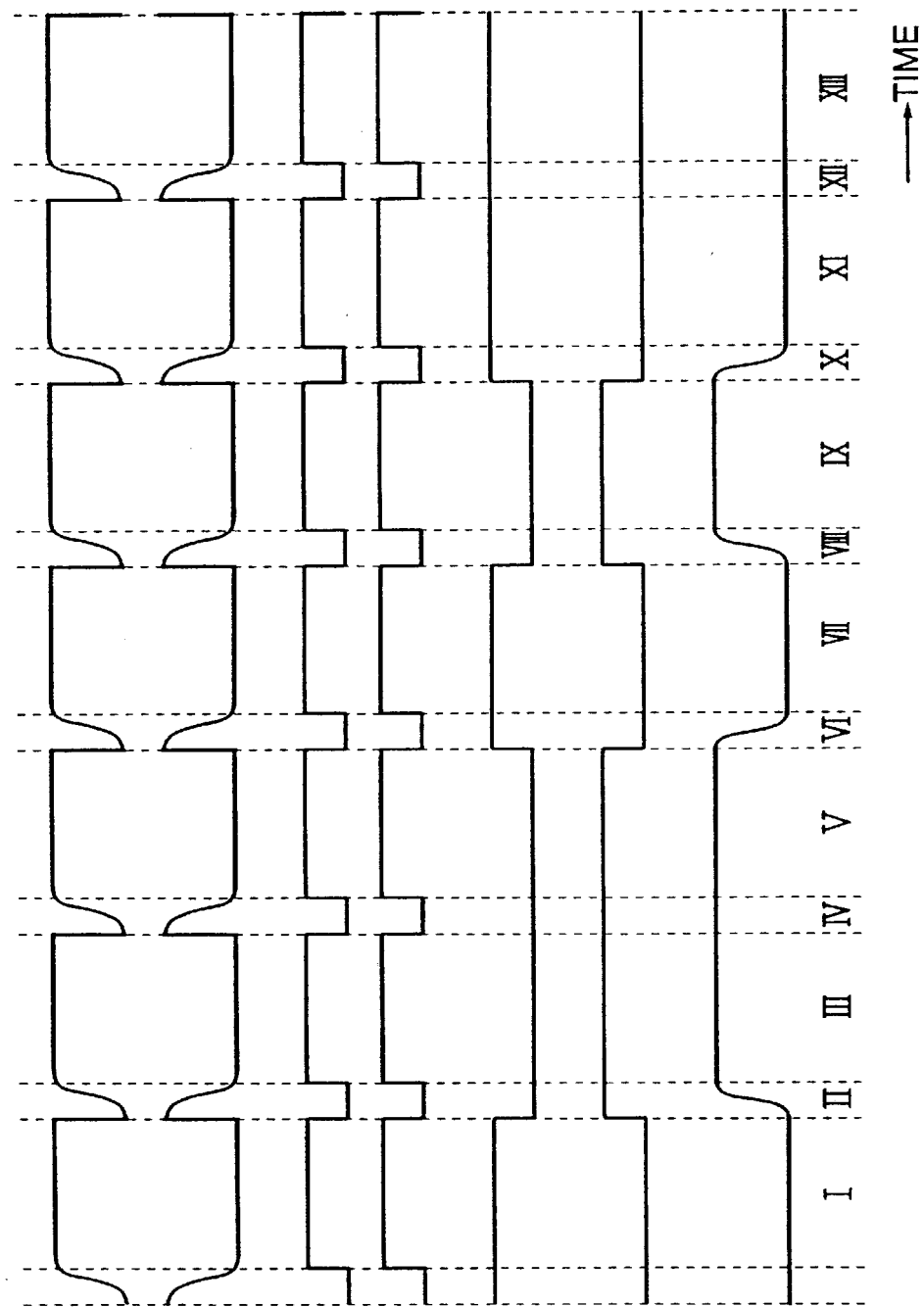

DRIVING METHOD AND APPARATUS FOR DISPLAY DEVICE

CROSS-REFERENCE TO RELATED APPLICATIONS

This is a continuation-in-part of U.S. Ser. No. 08/006,718 filed Jan. 2, 1992 which is a continuation of U.S. Ser. No.07/398,857 filed Aug. 25, 1989.

BACKGROUND OF THE INVENTION

The present invention relates a switching circuit for passing-through or cutting-off continuous or intermittent high voltage signals and a display device using same, and in particular to a switching circuit suitable for controlling a high voltage pulse signal by means of a low voltage signal and a display device using same.

Heretofore a switching circuit for passing-through or cutting-off an input signal by means of semiconductor elements is discussed in "How to use FETs" pp. 110–114, published by CQ Publishing Co. Ltd., 1983, in which a method is described, by which a small signal is inputted in the source of an MOS transistor and an output signal is taken out from the drain, whereby the potential of the body (substrate) is set with respect to the source or the drain so that the p-n junctions therebetween are never biased in the forward direction under any conditions and the signal conduction and cutting-off is controlled by the gate voltage.

However by the prior art technique any attention is paid neither to passing-through or cutting-off high voltage signals nor to utilizing positively a stray diode between the drain and the body.

Further, there are disclosed heretofore a method for driving a plurality of electrodes of display elements, which are capacitive loads, a method for driving a circuit therefor by means of simple push-pull circuits, and a method, by which an energy recovery circuit is used for reducing electric power consumption.

In the former push-pull circuits, as indicated in FIG. 39, there are disposed switching circuits 1201 between a high voltage power supply 1115 and electrodes 1112 of display elements 604, 607, 610 and switching circuits 1202 between the electrodes 1112 and the ground level, and high voltage pulses are applied to the electrodes 1112 by on-off controlling these circuits 1201 and 1202. When the circuit is driven in this way, consumption power for charging and discharging the electrodes increases.

SUMMARY OF THE INVENTION

By the latter method, by which an energy recovery circuit is used, it is possible to decrease significantly this consumption power for charging and discharging the electrodes. For example, in JP-A-63-101897, there is described a method, by which electric charge stored in the electrodes and released therefrom at charging and discharging the electrodes is recovered by utilizing resonance of inductance elements and the electrodes which are capacitive loads. According to this example, it is disclosed that the circuit can be driven by an electric power a 1/10 time as small as that required by a prior art circuit.

On the other hand, when the electrodes which are capacitive loads are driven, it makes integration difficult to dispose an energy recovery circuit for each of the electrodes, because the energy recovery circuit includes an inductance and also it is not advisable with respect to the number of parts. Therefore it is preferable to dispose an energy recovery circuit in common for all the electrodes. In this case, for a driving method, by which presence or absence of the high voltage pulse differs for different display elements, it is necessary to dispose a switching circuit between the energy recovery circuit and each of the electrodes. This switching circuit is disclosed e.g. in JP-A-2-92111. In this example it is also disclosed to recover energy stored and released at charging and discharging the electrodes through a switch.

A first object of the present invention is to provide a simple switching circuit utilizing positively the stray diode existing between the drain and the body of an MOS transistor.

A second object of the preset invention is to provide a high voltage signal switching circuit, which controls particularly the passing-through and cutting-off of a high voltage signal by means of a low voltage signal.

A third object of the present invention is to provide a capacitive load driving device, which drives a capacitive load with a low electric power consumption, and a display device using same.

A fourth object of the present invention is to provide a method for driving display elements, by which a simple circuit construction, in which electric power consumption is low and width of the high voltage pulse can be controlled, is driven, and to provide a circuit for realizing same.

By the method for driving the electrodes by using push-pull circuits according to the prior art technique, there is a problem that charging and discharging electric power is great, which increases power consumption of the whole device. For example, heretofore high withstand voltage driver ICs are used usually in this type of driving circuits, and power consumption of the high withstand voltage driver ICs increases with increasing frequency of the driving pulse. This may give rise to cases where the high withstand voltage driver ICs are damaged by heat produced therein, which impairs remarkably reliability of the device.

Further, the method for recovering energy stored and released at charging and discharging the electrodes by using switching circuits according to the prior art technique is one, by which only presence or absence of the applied high voltage pulse is controlled and neither rise nor fall of the pulse is controlled for the purpose of controlling the pulse width. Depending on the mode of driving a display device, presence or absence of the high voltage pulse is not controlled but the pulse width of the high voltage pulse should be controlled. For example, for address electrodes of an AC type plasma display, it is necessary to control the pulse width of the high voltage pulse according to signals to be displayed. For such driving, it is necessary to control rise or fall of the pulse. However, heretofore, nothing is mentioned thereon.

Consequently the fourth object of the present invention is to provide a driving method having a low electric power consumption in spite of the pulse width which can be arbitrarily selected and a circuit for realizing same.

The above objects can be achieved by using an N-type MOS transistor as a switching element for a positive pulse input signal; connecting at least a resistor or a protection diode or both between the gate and the source of the MOS transistor stated above, the drain of the MOS transistor stated above serving as a positive pulse input terminal, the source of the MOS transistor stated above serving as an output terminal; and driving the gate of the MOS transistor stated above by means of a second transistor, which is a current control device. A positive pulse means a rectangular part, which rises from a low level with an input signal and falls after having kept a high level for a certain time.

Further the above objects can be achieved by using a P-type MOS transistor as a switching element for a positive pulse input signal; connecting at least a resistor or a protection diode or both between the gate and the source of the MOS transistor stated above, the source of the MOS transistor stated above serving as a positive pulse input terminal, the drain of the MOS transistor stated above serving as an output terminal; and driving the gate of the MOS transistor stated above by means of a second transistor, which is a current control device.

Still further the above objects can be achieved by using an N-type MOS transistor as a switching element for a negative pulse input signal; connecting at least a resistor or a protection diode or both between the ate and the source of the MOS transistor stated above, the source of the MOS transistor stated above serving as a negative pulse input terminal, the drain of the MOS transistor stated above serving as an output terminal; and driving the gate of the MOS transistor stated above by means of a second transistor, which is a current control device. A negative pulse means a rectangular part, which falls from a high level and rises after having kept a low level for a certain time.

Still further the above objects can be achieved by using a P-type MOS transistor as a switching element for a negative pulse input signal; connecting at least a resistor or a protection diode or both between the gate and the source of the MOS transistor stated above, the drain of the MOS transistor stated above serving as a negative pulse input terminal, the source of the MOS transistor stated above serving as an output terminal; and driving the gate of the MOS transistor stated above by means of a second transistor, which is a current control device.

The second current controlling transistor described above works for switching-off that MOS transistor switching element, when the source of the MOS transistor stated above serves as an input terminal for a positive or negative pulse, and it works so as to switch-on forcedly the switching element, when the drain of the MOS transistor stated above serves as an input terminal.

Further the switching circuit works similarly, even if the MOS transistor stated above serving as the switching element is replaced by a bipolar transistor.

The switching circuit according to the present invention can be used appropriately for a control circuit for the display in a display device, in which high voltage signals generated according to the signal for image display are applied to display elements. Furthermore, at this time, a still greater effect can be obtained, if it is used, combined with an energy recovery circuit.

The fourth object can be achieved by a more concrete driving method, by which drive of a plurality of electrodes of display elements, which are capacitive loads, is effected by a method for recovering energy through switches so that current paths for charging the electrodes differ from current paths for discharging them.

It can be achieved also by effecting simultaneously charging and discharging of the electrodes of the display elements.

Further, it can be achieved also by detecting the number of electrodes, which are being charged, and the number of electrodes, which are being discharged, among the electrodes of the display elements and by controlling inductance values for energy recovery, depending on the numbers thus detected.

Still further, the fourth object can be achieved by a more concrete construction, in which series circuits, each of which includes a first switch, a first diode, and a first inductance element, are connected with a power supply or a charged capacitive element and the output terminal thereof is connected with at least two electrodes through at least two first unidirectional switches, the first switch, the first diode, and the first unidirectional switches being conductive, when the electrodes are being charged; and series circuits, each of which includes a second switch, a second diode, and a second inductance element, are connected with the power supply or the charged capacitive element and the output terminal thereof is connected with at least two electrodes through at least two second unidirectional switches, the second switch, the second diode, and the second unidirectional switches being conductive, when the electrodes are being discharged.

Further it can be achieved by connecting a switching circuit with the output terminal of the first inductance element, which switching circuit holds it at the level of the high voltage power supply, and a switching circuit with the output terminal of the second inductance element, which switching circuit holds it at the level of the low voltage power supply.

Still further it can be achieved by constructing the first and second unidirectional switches by using series connecting circuits, each of which includes a diode and an FET.

Still further it can be achieved by constructing the first and second unidirectional switches by using bipolar transistor circuits.

Still further it can be achieved by constructing each of the plurality of series circuits by a first switching circuit, a first diode, and a first inductance element, reciprocals of inductance values of a plurality of first inductance elements forming approximately a binary system, and each of the plurality of series circuits by a second switching circuit, a second diode, and a second inductance element, the inductance values of a plurality of second inductance elements forming approximately a binary system.

Still further it can be achieved by connecting each of the electrodes of the display elements with a voltage hold circuit holding it at the level of the high voltage power supply and another voltage hold circuit holding it at the level of the low voltage power supply.

Still further it can be achieved by making the electrodes of the display elements serve as address electrodes of an AC type plasma display.

BRIEF DESCRIPTION OF THE DRAWINGS

FIG. 1 is a circuit diagram showing an embodiment of the present invention;

FIG. 2 is a time chart indicating a timing of operation thereof;

FIG. 3 is an equivalent circuit diagram at the charging of the circuit indicated in FIG. 1;

FIG. 4 is a time chart indicating a timing of operation of the circuit according to the present invention indicated in FIG. 1;

FIG. 5 is a circuit diagram showing an embodiment of the present invention;

FIG. 6 is a time chart indicating a timing of operation of the circuit construction indicated in FIG. 5;

FIG. 7 is a circuit diagram sowing an embodiment of the present invention;

FIG. 8 is a time chart indicating a timing of operation of he circuit construction indicated in FIG. 7;

FIG. 11 is a circuit diagram of another embodiment of the present invention;

FIG. 12 is a time chart indicating a timing of operation of the circuit construction indicated in FIG. 11;

FIG. 20 is a circuit diagram showing an example of the switch for a negative pulse according to the present invention;

FIG. 21 is a time chart indicating a timing of operation of the circuit indicated in FIG. 20;

FIG. 22 is a time chart indicating another timing of operation;

FIGS. 23, 24, 25, 26, 27 and 28 are circuit diagrams showing various embodiments of the present invention;

FIG. 33 is a circuit diagram showing an embodiment of the present invention;

FIG. 34 is a circuit diagram showing another embodiment of the present invention;

FIG. 35 is a time chart indicating a timing of operation of the circuit indicated in FIG. 34;

FIG. 44 is a time chart for explaining operation of each of the switching circuits according to the present invention.

DESCRIPTION OF THE PREFERRED EMBODIMENTS

Figure 9:
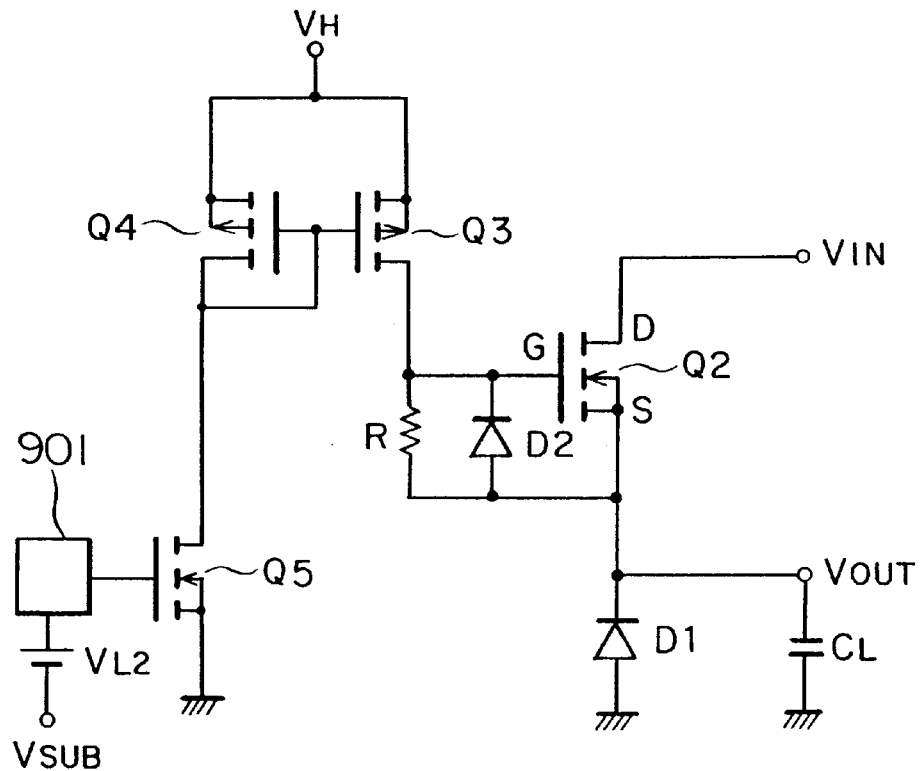
FIG. 9 is a circuit diagram showing an embodiment of the present invention.

Hereinbelow some embodiments of the present invention will be explained in detail, referring to the drawings.

FIG. 1 is a circuit diagram showing a switching circuit, which is an embodiment of the present invention, and FIG. 2 is a time chart indicating a timing of operation thereof.

In FIG. 1, Q1 represents a PNP type transistor as a bipolar transistor for the current circuit stated above; Q2 an N channel MOS FET acting as a driving element, which passes-through or cuts-off high voltage signals; and $C_L$ a capacitive load.

In the basic circuit described in the present embodiment, the FET Q2 plays the role of the switch, which passes-through and cuts-off a high voltage pulse $V_{IN}$ by the gate voltage $V_G$ of the FET Q2 according to a low voltage input signal $V_C$ (101). At the conduction the high voltage pulse $V_{IN}$ is applied from the drain D side to the source S side and thus the FET Q2 has a function to feed the capacitive load $C_L$.

Now the operation thereof will be explained, according to the time chart indicated in FIG. 2.

Since the transistor Q1 works in the emitter grounded type, an "L" level ($V_H$–$V_{DD}$) of $V_C$ indicated in FIG. 2 is applied to the base B so that the transistor Q1 is turned on. The voltage at the emitter E is higher than the base voltage by about 0.7 V, if the transistor is a silicon element. The difference between this emitter voltage and the high power supply voltage $V_H$ is applied across a resistor 102, producing a current $I_O$.

The current $I_O$ flows out from the collector C of the transistor Q1 and passes through a resistor R, while charging the gate input capacitance $C_i$ of the FET Q2. In this way a voltage is generated between the base and the source of the FET Q2.

FIG. 3 shows an equivalent circuit of the circuit charging the gate input capacitance $C_i$ of the FET Q2. The gate voltage $V_G$ is given by the following equation.

$$VG = I_o R\left(1 - e^{-\frac{1}{\tau}t}\right) \quad (1)$$

where $\tau = C_i R$; R is the resistance of the resistor R in FIG. 1; and $I_O$ represents the intensity of the current.

$\tau$ in the above equation indicates the rise time constant of the FET Q2. Supposing that the resistance R is e.g. 30 kΩ and $C_i$ is e.g. 100 pF, $\tau$ is equal to 3 μsec. As it can be seen from Eq. (1), it is possible to determine the current intensity $I_O$ and the time constant $\tau$ independently from each other. In order to drive the FET Q2 with a high speed, the rise time constant $\tau$ should be as small as possible.

Concretely speaking, since the gate input capacitance $C_i$ is determined by the structure of the element. However, if the resistance R is small, the voltage between the gate G and the source S of the FET Q2 is lower than the threshold value ($V_{TH}$) and thus the conduction is insufficient. Therefore the current intensity $I_O$ is increased so that the voltage between the gate G and the source S is above the threshold value stated above. However, if this voltage is too high, the voltage between the gate G and the source S exceeds the withstand voltage $V_{GS}$ max and destroys the element. In order to prevent it, a zener diode 104 is connected in parallel with the resistor R between the gate G and the source S. Consequently, concerning the product of R and $I_O$, the following relation is valid:

$$\frac{V_{TH}}{1-e^{-T/C_iR}} < I_oR < \frac{V_{GSmax}}{1-e^{-T/C_iR}},$$

where T represents the pulse period of the input signal $V_{IN}$.

In this way it is possible to drive the gate with a high speed to reduce the resistance R between the drain D and the source S so that the FET Q2 serving as the switching element is in the conductive state.

Now the $T_2$ period of the low voltage input signal $V_C$ in FIG. 2 is explained.

The transistor Q1 and the FET Q2 are in the cut-off state by applying the low voltage input signal $V_C$ at the "H" level to the input terminal 101.

The electric charge stored in the capacitive load $C_L$ and the gate input capacity $C_i$ is discharged towards the "L" level (OV in FIG. 2) of the high voltage plase-shaped drain voltage on the drain D side during a period of time where there is no pulse, passing through the parasitic diode between the drain and the body. When the electric charge stored in the capacitive load on the source S side is discharged gradually, the peak value of the pulse becomes lower and lower, as indicated by P1 and P2 in FIG. 2, and finally it reaches the $V_L$ level.

According to the embodiment described above, in the case where a high voltage of 200–300 V is applied, the switch, which required heretofore a more complicated construction, can have a more simple construction capable of driving the driving element at the output stage with a low voltage.

Next FIG. 4 indicates an example, in the case where the control signal $V_C$ for the transistor Q1 in FIG. 1 is a pulse signal synchronized with the pulse of the high voltage input signal $V_{IN}$. This reduces the electric power for driving the gate of the FET Q2 during the conductive period $T_1$ by taking the current $I_O$ flowing through the transistor Q1 by a pulsed current. As indicated in FIG. 4, the signal $V_C$ inputted in the base of the transistor Q1 during the conductive period $T_1$ of the FET Q2 is composed of pulses, whose duration at the "L" level is $t_O$. At this time, as a condition, under which the MOS FET Q2 is satisfactorily turned on and the gate voltage doesn't exceed the withstand voltage ($V_{GSmax}$), similarly to that described above, the following inequality should be valid;

$$\frac{V_{TH}}{1-e^{-t_0/C_iR}} < I_oR < \frac{V_{GSmax}}{1-e^{-t_0/C_iR}}.$$

Next a case where a PNP transistor (Q1) is used for the bipolar transistor for the current circuit described above and a P channel FET (Q2) for the switching element will be explained, referring to FIGS. 5 and 6.

In FIG. 5, the source of the P channel FET (Q2) serves as the input terminal for the high voltage signal $V_{IN}$ and the drain thereof as the output terminal, in which a diode 504 is connected between the gate and the source. The emitter side of the transistor Q1 in the current control circuit is connected with the power source $V_H$ having the same level as the H level of the high voltage signal $V_{IN}$ through a resistor 502 controlling the intensity of the current. FIG. 6 shows variations of the input signal $V_{IN}$, the control signal $V_C$ and the output signal $V_{OUT}$ for this switching circuit construction. When the FET Q2 serving as the switching element is turned to the conductive state ($T_1$ in FIG. 6), it turns off the current control circuit. At this time when the high voltage pulse is applied to $V_{IN}$, a potential difference takes place automatically between the gate and the source of the FET Q2 owing to the Zener diode (504 in FIG. 5), which turns on the FET Q2. Then, when the FET Q2 is switched off, as indicated by $V_C$ in FIG. 6, a negative pulse synchronized with the high voltage signal $V_{IN}$ is applied to the base 501 of the transistor Q1 in FIG. 5. At this time the potential at the gate of the FET Q2 is $V_H$ owing to the fact that the transistor Q1 is switched on and thus the FET Q2 is switched off, even if the pulse amplitude of the high voltage signal $V_{IN}$ is $V_H$, because there is no potential difference between the gate and the source thereof.

Next a case where a voltage hold circuit is added to the switching circuit indicated previously in FIG. 1 will be explained, referring to FIGS. 7 and 8.

A case where an N channel FET Q3 is used as a voltage hold circuit element will be described.

The transistor Q1 swerving as a current source element has the same function as that of the transistor Q1 indicated in FIG. 1. Here the voltage $V_C$ indicated in FIG. 8 is applied to the input terminal 701. In the period T1, similarly to the period T1 indicated in FIG. 2, the FET Q2 is switched on and thus the high voltage pulse-shaped drain voltage $V_{IN}$ applied to the drain D side produces the source voltage $V_{OUT}$ on the source S side, which is applied to the capacitive load $C_L$.

Then, in the period T2 also, similarly to the period T2 indicating FIG. 2, the FET Q2 is switched off. The electric charge stored in the input capacitance and the capacitive load during the T1 period is discharged towards the "L" level (OV) of the high voltage pulse-shaped drain voltage $V_{IN}$, passing through the parasitic diode of the FET Q2. At this time in order to fix the potential on the source S side, a hold input signal $V_S$ indicated in FIG. 8 is applied to the gate G input terminal 702 of the FET Q3 serving as the voltage hold element. The FET Q3 is switched on by the "H" level of the hold input signal $V_S$.

In this way the potential $V_{OUT}$ at the drain of the FET Q3 is 0 V and held. Consequently, as indicated in FIG. 8, the potential $V_{OUT}$ at the source S of the FET Q2 is fixed at the "L" level (0 V) and held. Although explanation has been made in the above by using an N channel FET for the FET Q2, a P channel FET can be operated similarly with the voltage hold circuit. Further, not only the FET but also a transistor (NPN or PNP), to which a diode is connected in parallel, can be operated similarly.

FIG. 9 is a circuit diagram showing another embodiment of the present invention. Contrarily to the fact that in the circuit indicated previously in FIG. 1 the FET Q2 is switched by a signal on the high voltage over source side, in the circuit in the present embodiment the FET Q2 is switched by a signal on the ground potential side. A resistor R and a Zener diode have the same functions as those explained, referring to FIG. 1.

A P channel FET Q3 is an element for witching the current $I_O$ just as the transistor Q1 indicated in FIG. 1 and this element is driven with a level shifted so that it can be controlled by a signal voltage between the ground potential and the low voltage power source voltage $V_{PD}$ by means of a P channel FET Q4 and an N channel FET Q5 constituting a current mirror circuit together with the FET Q3 described above.

Further the applied drain voltage VIN has the same waveform as that indicated in FIG. 2. Reference numeral 901 represents a signal circuit for driving the N channel FET Q5. It includes e.g. a shift register circuit and a latch circuit and has a function to convert image signals inputted in serial into parallel signals to output the signals in parallel. The power source voltage for this signal circuit is the low voltage power source voltage $V_{DD}$.

In this circuit, as described later, the PN junction isolation semiconductor layer is set at a voltage lower than the ground voltage so that the PN junction for the component isolation is never biased in the forward direction, even if the output voltage $V_{OUT}$ is lowered to a value below the ground voltage.

A diode D1 in FIG. 9 is provided so that the output voltage $V_{OUT}$ doesn't drop beyond the ground potential.

Figure 10:
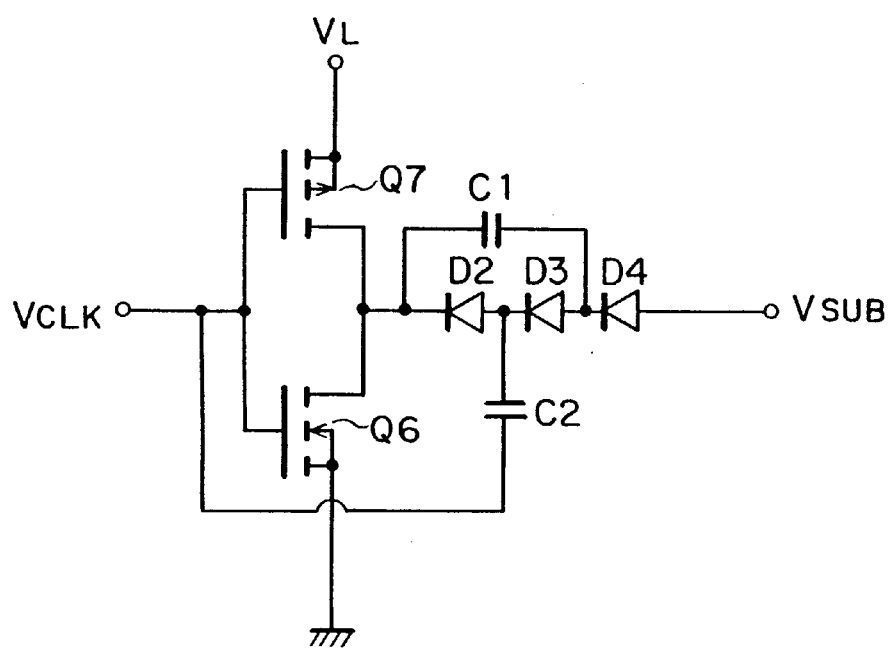
FIG. 10 is a circuit diagram of a negative voltage circuit, which can be used in the circuit indicated in FIG. 9.

FIG. 10 illustrates an example of the construction of a negative voltage circuit, which can be used in the circuit indicated in FIG. 9. This circuit can lower the voltage of the P conductivity type semiconductor layer for the component isolation to a voltage lower than the ground voltage by about 7 V according to the charge pump principle by using a clock signal $V_{CLK}$ applied to a capacitor $C_Z$ and a signal obtained by applying the clock signal $V_{CLK}$, whose sign is inverted by an inverter circuit constituted by an N channel FET Q6 and a P channel FET Q7, to the cathode side of a diode D2.

FIG. 11 is a circuit diagram of another embodiment of the present invention and FIG. 12 shows working waveforms therefor, in which $V_{IN}$ indicates a pulse input voltage; $V_{OUT}$ the output voltage; $V_C$ the switch control voltage; $V_H$ the power source voltage for a high voltage circuit; and $V_{DD}$ the power source voltage for a low voltage circuit (logic circuit). Q2 indicates an N channel MOS transistor for switching and Q3 an N channel MOS transistor disposed for controlling the switch so as to be in the conductive mode or in the cut-off mode. D is a diode which acts as the current path to the ground, when the source voltage of the MOS transistor Q2 is made fall. Further it is also possible to make it work for protecting the gate of the MOS transistor. Q1 is a depletion type P channel MOS transistor.

Hereinbelow the working mode of the circuit indicated in FIG. 11 will be explained, referring to FIG. 12. By the conductive mode of the switch, which sets the control voltage $V_C$ at the "L" level, since current is supplied from the depletion type MOS transistor to the gate of the MOS transistor Q2, the MOS transistor Q2 is in the ON state. For this reason, when a voltage pulse is applied to the input terminal $V_{IN}$, the source voltage (output voltage $V_{OUT}$) rises, following the rise of the drain voltage (input voltage $V_{IN}$). When the input voltage $V_{IN}$ falls, since the parasitic diode existing between the drain and the body of the MOS transistor Q23 is biased in the forward direction, the output voltage $V_{OUT}$ falls also, following it. That is, it is possible to make the input voltage pulse pass-through to the output side. On the other hand, by the switch cut-off mode, where the control voltage $V_C$ is at the "H" level, it is performed by the MOS transistor Q3 to draw-in the current holding the gate and the source of the MOS transistor Q2 at the ground level so that the MOS transistor is in the OFF state. For this reason, even if a voltage pulse is applied to the input terminal $V_{IN}$, the source voltage (output voltage $V_{OUT}$) doesn't follow the rise of the drain voltage (input voltage $V_{IN}$) to rise. That is, it is possible to cut off the input voltage pulse so as not to make it pass-through to the output side.

In FIG. 11, an insulated gate type bipolar transistor or an NPN transistor, with which a diode is connected in parallel, may be used for the switching MOS transistor Q2.

In the present embodiment a depletion type MOS transistor or a junction gate type transistor of depletion type is disposed between the drain and the gate as means for raising also the potential at the gate at the rise of the potential at the drain. For this reason an advantage can be obtained that a constant current can be supplied, almost independently of the voltage between the gate and the drain of the MOS transistor. Although in the present invention a P channel depletion type MOS transistor is used, the same effect can be obtained also if an N channel depletion type MOS transistor, in which the gate and the source are connected, is used.

Figure 13:
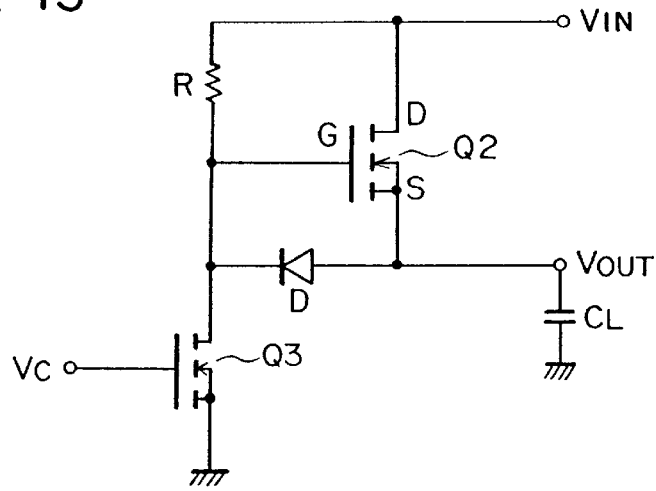
FIGS. 13, 14 and 15 are circuit diagrams showing still other embodiments of the present invention.

FIG. 13 is a circuit diagram of another embodiment of the present invention. In the present embodiment a resistor R is used as means for raising the potential at the gate at the rise of the potential at the drain. A resistor made of polycrystalline silicon, which has a small parasitic capacitance and with which a high maximum applicable voltage can be easily realized, is suitable for this resistor.

Figure 14:
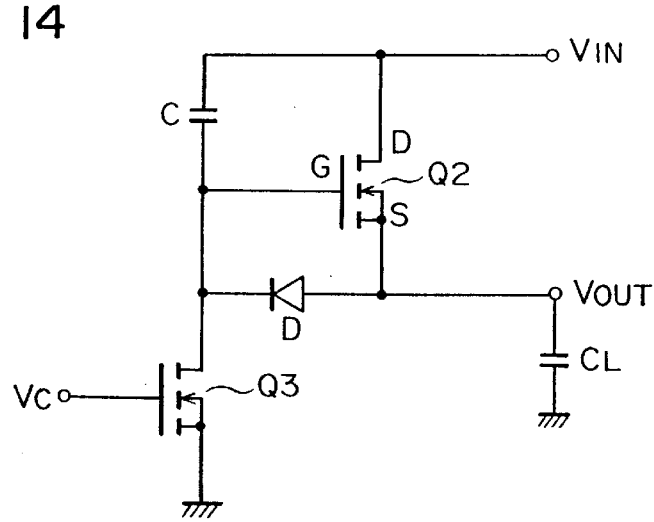

FIG. 14 is a circuit diagram of still another embodiment of the present invention. In the present embodiment a capacitor C is used as means for raising the potential at the gate at the rise of the potential at the drain. For this reason the present embodiment has an advantage that the driving current for switching on the MOS transistor Q2 with respect to those required in the embodiments indicated in FIGS. 11 and 13.

Figure 15:
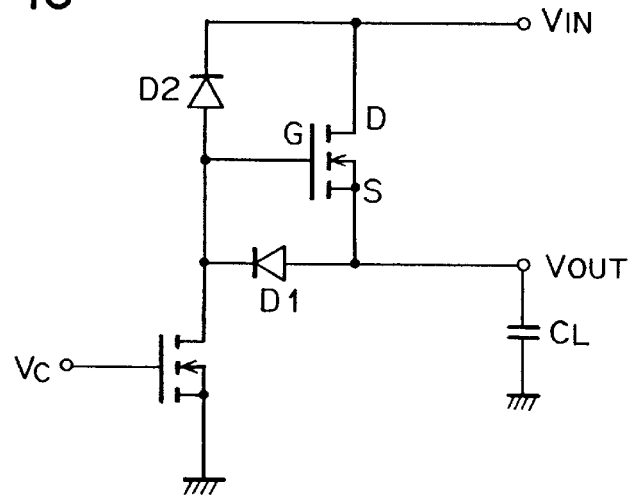

FIG. 15 is a circuit diagram of still another embodiment of the present invention. In the present embodiment a diode D2 is used as means for raising the potential at the gate at the rise of the potential at the drain. In the case of the present embodiment the diode D2 is used as the capacitor described in the embodiment indicated in FIG. 14. The case where the diode is used has an advantage that a high voltage input pulse can be dealt with, because it is easy to use a high voltage between the gate and the drain.

Figure 16:
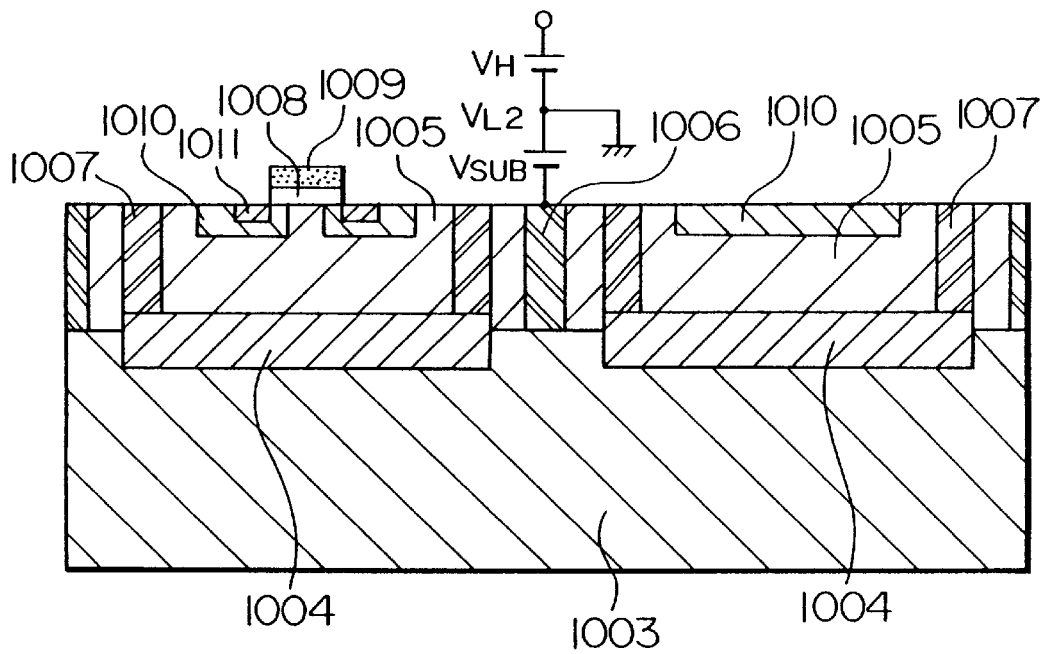
FIG. 16 is a cross-sectional view of an integrated circuit.

FIG. 16 is a cross-sectional view of the state, where the FET Q2 and the diode D1 in FIG. 9 are formed in an integrated circuit. As described previously, the diode D1 acts as a hold circuit for preventing that the output voltage $V_{OUT}$ is lowered to a value below the ground voltage. In the circuit indicated in FIG. 16, the potential of P conductivity type semiconductor layers 1003 and 1006 for the component isolation is set at a value below the ground voltage so that even if the output voltage $V_{OUT}$ is lowered below the ground voltage, the PN junction for the component isolation (between 1003 and 1004) is never biased in the forward direction.

Explaining more in detail, the present figure shows the cross-sectional view of the semiconductor device indicating the connecting point of $V_{SUB}$ indicated in FIGS. 9 and 10 and a wiring scheme of the power source. The semiconductor device indicated in the present figure has a structure, in which the semi-conductor element is isolated from the P conductivity type semiconductor substrate 1003 by a P conductivity type diffusion layer 1006. The left side of the present figure shows a vertical type MOS transistor, in which the source is an N conductivity type diffusion 1011; the body is a P conductivity type diffusion layer 1010; and the drain is an N conductivity type diffusion layer 107 and an N conductivity type buried layer 1004. On the other hand the right side shows the cross-sectional view of the diode D1 indicated in FIG. 9, in which the anode is a P conductivity type diffusion layer 1010, and the cathode is N conductivity type diffusion layers 105, 1004 and 1007.

The cross-sectional view itself of the present semiconductor device is heretofore well-known. However a feature of the present structure consists in that the potential of the P conductivity type semiconductor layers 1006 and 103 for the component isolation is not equal to the ground voltage but it is set a value lower the ground voltage by $V_{L2}$, serving as $V_{SUB}$. For example, when the output voltage $V_{OUT}$ is lowered below the ground voltage, this means that the cathode region (1005, 1004 and 1007) of the diode on the right side in FIG. 10 is lowered below the ground voltage.

In the case, where the potential of the P conductivity type semiconductor substrate is set at the ground voltage, as it is the case by the prior art method, the PN junction between the P conductivity type layer 1003 and the cathode region described above is biased in the forward direction. Therefore current flows through the P conductivity type semiconductor layer 1003 for the component isolation and a parasitic bipolar transistor existing between adjacent elements is turned to the ON state, which causes an erroneous operation, which gives rise to a problem. This can be prevented owing to the present structure.

Further, since the junction capacity with respect to the substrate, i.e. referring to the example indicated in FIG. 10, the capacity between the rain region 1004 of the MOS transistor and the substrate 1003, is reduced, another effect can be also obtained that the elements isolated by the PN junction can be driven with a high speed.

In order to set the voltage of the P conductivity type semiconductor layer for the component isolation at a value lower than the ground voltage by $V_{L2}$, an external power source may be used. However, by using the negative voltage circuit as indicated in FIG. 10, the object of obtaining the voltage $V_{SB}$ of the P conductivity type semiconductor layer for the component isolation can be achieved without using any external negative voltage source.

Figure 17:
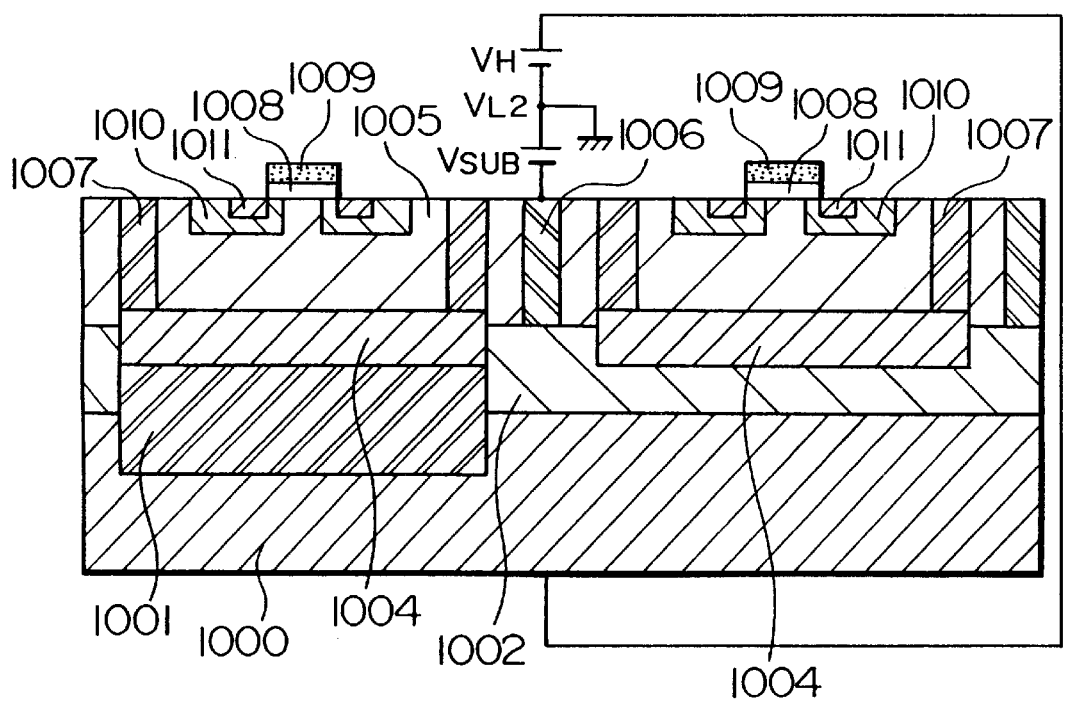
FIG. 17 is a cross-sectional view of another embodiment of the integrated circuit.

FIG. 17 is a cross-sectional view of another embodiment of the semiconductor device described above by the method of applying the substrate voltage and a wiring diagram of the power source.

The semiconductor device indicated in the present figure is a semiconductor device, in which a vertical type MOS transistor (on the left side in the figure), in which an N conductivity type substrate acts as the drain, and a vertical type MOS transistor having a structure similar to that indicated on the left side in FIG. 10, in which the component isolation is effected by a P conductivity type epitaxial layer 1002 and a P conductivity type diffusion layer 1006, coexist. The figure shows also the method of applying the substrate voltage therefor.

In the present figure, as described above, since the P conductivity type epitaxial layer 1002 and the P conductivity type diffusion layer 1006 act as the P conductivity type semiconductor layer for the component isolation, wiring is effected so as to set the potential of this region at a value below the ground voltage. In the present example of structure a parasitic bipolar transistor, in which an N conductivity type layer 1000 serves as the collector; the P conductivity type layer 102 as the base; and an N conductivity type layer 1004, is originally apt to work.

As described above, when generally the potential of the P conductivity type semiconductor layer used for the component isolation in a PN junction isolation type semiconductor integrated circuit device is lowered below the ground voltage, even if the potential at the output terminal is lowered below the ground voltage, depending on the state of the load, it is possible to prevent that the parasitic element is turned to the ON state by the fact that the PN junction for the component isolation is biased in the forward direction, which gives rise an erroneous operation, by setting the potential of the P conductivity type semiconductor layer used for the component isolation at a still lower value and further another effect can be obtained that the element can be driven with a high speed.

Figure 18:
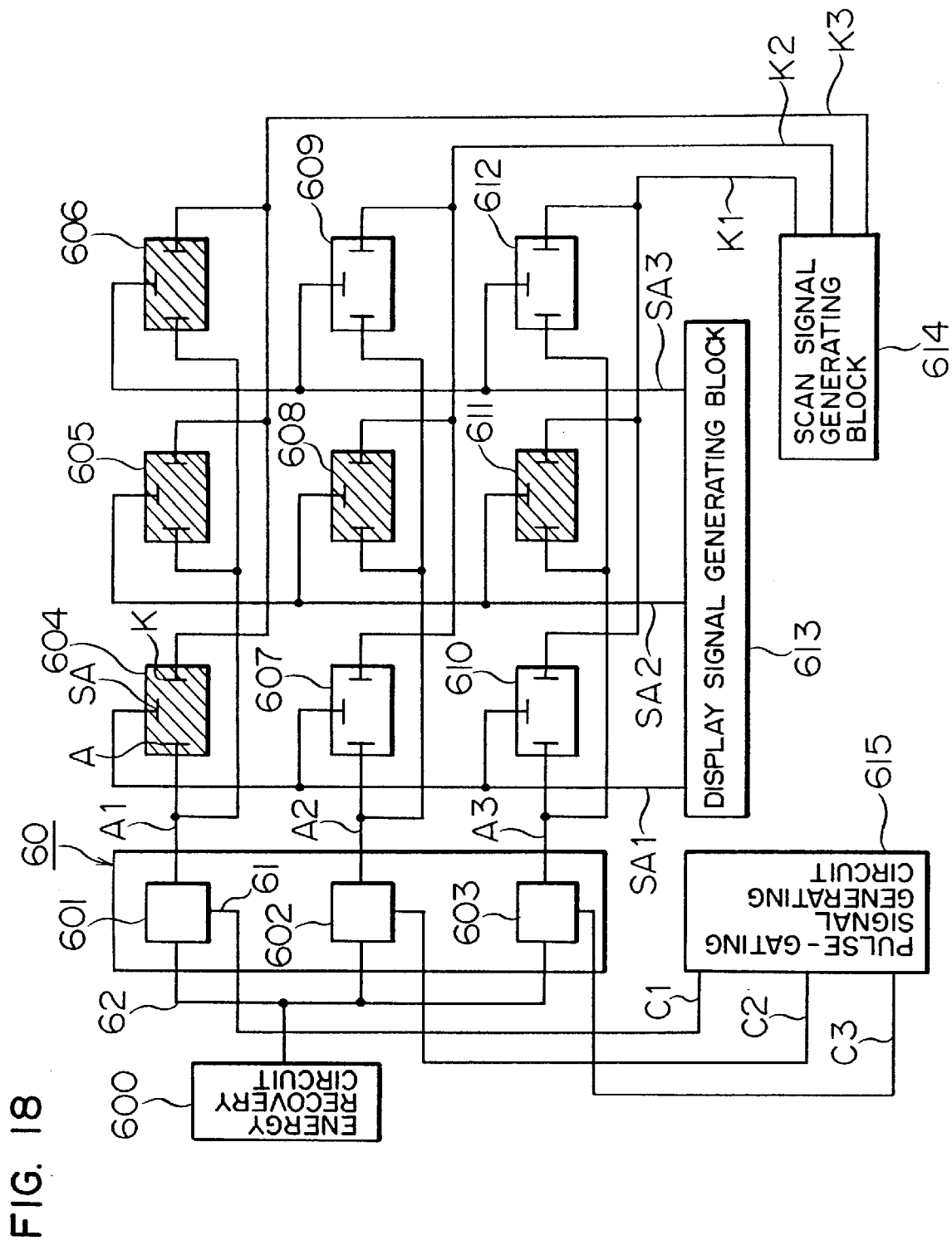
FIG. 18 is a scheme showing the circuit construction, when the present invention is applied to a matrix display device.
Figure 19:
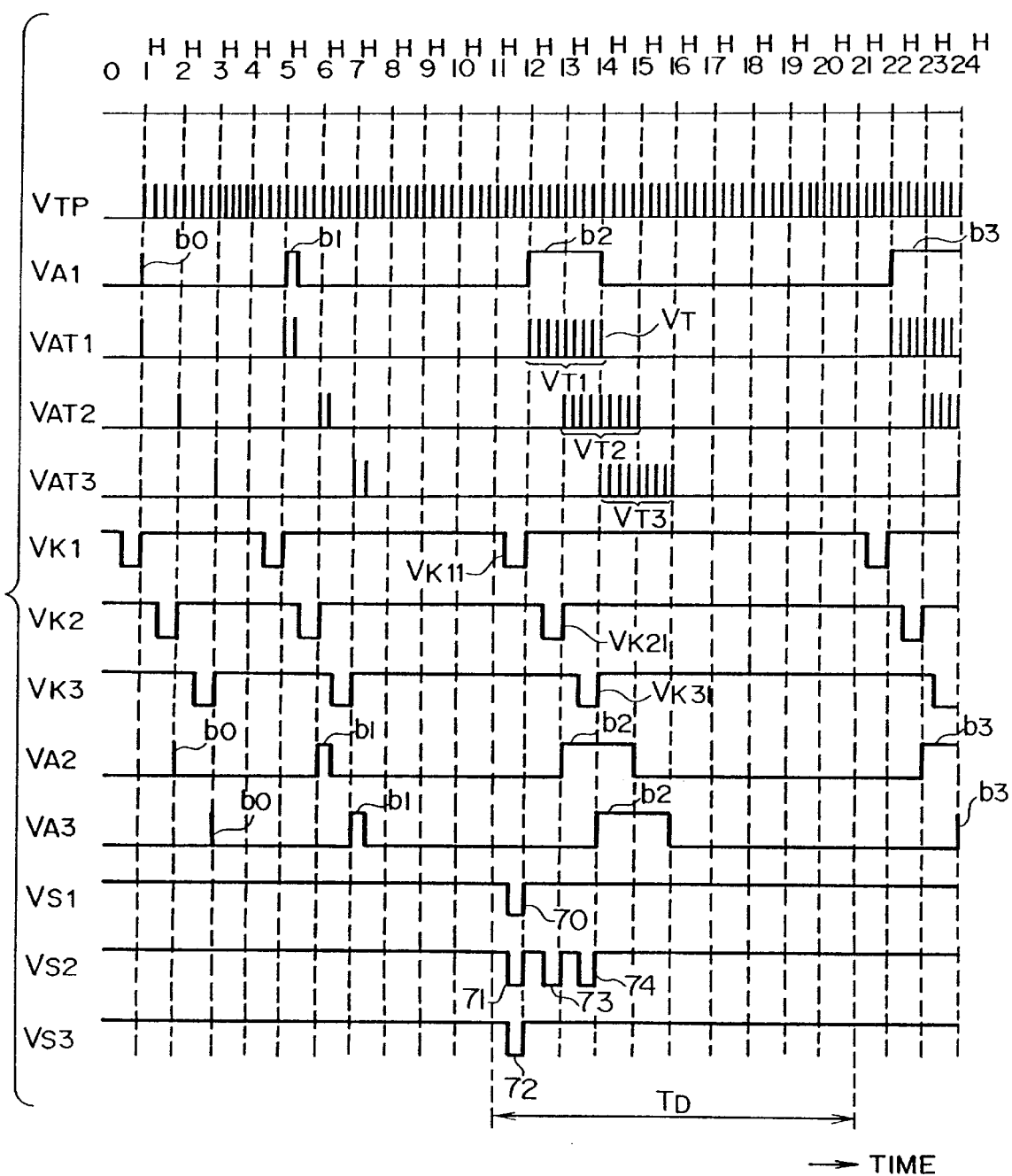
FIG. 19 shows an example of voltage waveforms applied to different electrodes in the circuit in FIG. 18.

Next an example, in which the present switching circuit is used in a display device, is explained, referring to FIGS. 18 and 19. In the present embodiment discharge cells are used as an example of the capacitive load.

In the case where the discharge cells are driven by image signals, the discharge cells are arranged vertically and horizontally, as indicated in FIG. 18, and the image signals are applied to electrodes thereof. One of the discharge cells used in the present embodiment has a 3-electrode structure, as indicated in FIG. 18, and consists of an anode electrode A, a cathode electrode K and a subanode electrode SA. In the present embodiment a case where the discharge cells are arranged in 3 lines and 3 rows will be explained.

The basic construction of the display device consists of an anode driving system feeding the anode electrode A, a scanning signal generating block 614 for generating signals applied to the cathode electrode K and a display signal generating block 613 for generating display signals applied to the subanode electrode SA. Here the anode driving system consists of an energy recovery circuit 600, which generates a high voltage pulse $V_{TP}$ (same waveform as $V_{IN}$) and at the same time recovers electric power, a group of switching circuits 60 having a pulse distributing function for feeding each of lines for the anode electrode A and a pulse-gating generating circuit 615 for giving a pulse distributing signal.

In general, in the case where a capacitive load is driven, since the load capacity and the stray capacity of the circuit are charged up at the rise of the high voltage pulse, transient current flows. On the other hand, also at the fall of the high voltage pulse, since electric charge stored in the capacities described above is discharged, transient current flows. Since the discharge cells as a load constitute a capacitive load, transient current flows and electric power consumption is very great.

In order to reduce electric power consumed in the display device, as described above, generally an energy recovery circuit is used. Here the energy recovery circuit is a circuit consisting of a coil, a capacitor and a switching element, which stores the electric charge in the capacitor described above without consuming it n the resistor.

In order to recover the electric power with a high efficiency, it is necessary to dispose an energy recovery circuit and to recover the high voltage signal from each of the anode electrode A or distribute it to each of the anode electrodes A. For this purpose a pulse distributer is necessary, which can recover and distribute the high voltage signal in both the directions. The switch described above according to the present invention can be used for this purpose, as described below.

In the example of construction indicated in FIG. 18, in order to reduce the electric power of the signal applied to the anode electrode A, an energy recovery circuit is used and the group of switching circuits are disposed in the stage following it. Hereinbelow a case where the discharge cells are turned on by image signals will be explained in detail.

In the case where the discharge cells are turned on by the image signal, in general a method, by which the luminance is displayed while transforming it into the time duration, e.g. the time sharing within a field time method is used. By this method one field is divided into e.g. 7 sorts of period, the ratio of the durations being selected so as to be $2^0:2^1:2^2:2^3:2^4:2^5:2^6$ (0 to 6 bits). It is possible to display $2^7=128$ gray levels by combining the seven sorts of period.

FIG. 19 shows a time chart based on this method. In order to turn on the discharge cells, relevant voltages should be applied to the anode electrode A, the cathode electrode K and the subanode electrode SA. Further, in order to represent luminance information, it is necessary to apply townsend pulses $V_T$ to hold the discharge at the anode electrode A. The number of the townsend pulses is assigned according to the time sharing within a field time described above.

FIG. 19 shows waveforms $V_{AT1}$ to $V_{AT3}$ representing the assigned period described above. Here $0^H$ to $24^H$ within one field are indicated. Here $1^H$ corresponds to $63.5 \times 10^{-6}$ sec.

Hereinbelow a period $T_D$ in FIG. 19 will be explained.

In this period of time the discharge cell indicated in FIG. 18 is in the state, where the bit 2 information (b2 of FIG. 19) is turned on. That is, the first line A1 of the anode electrode A is set at the selected state by $V_{A1}$ and when a $V_{S1}$ pulse voltage 70 is applied to the first row $S_{A1}$ of the subanode electrode SA, a discharge cell 604 is turned on. However, it is supposed that a pulse voltage $V_{K1}$ given to the first line K1 is applied to the cathode electrode K.

When the procedure proceeds in the same way according to the time chart indicated in FIG. 19 such as the second line and the second row, the third line and the third row, and so forth, discharge cells 604, 605, 606, 608 and 611 are turned on by applied pulse voltages 71, 72, 73 and 74 on the subanode SA, voltage pulse series $V_{T1}$, $V_{T2}$ and $V_{T3}$ on the anode electrode A, and voltage pulse series $V_{K11}$, $V_{K21}$ and $V_{K31}$ on the cathode K. This state is indicated by hatching in FIG. 18.

The display signal generating block 613 generates voltage pulses $V_{S1}$, $V_{S2}$ and $V_{S3}$, responding to the luminance signal of the image. On the other hand the scan signal generating block 614 generates voltage pulses $V_{K1}$, $V_{K2}$ and $V_{K3}$ applied to different lines of the cathode electrode K. Further voltage pulses $V_{A1}$, $V_{A2}$ and $V_{A3}$ in FIG. 19 are generated by the pulse-gating generating circuit 615. The energy recovery circuit 600 performs the electric power recovery and the generation of the high voltage pulse $V_{TP}$ in FIG. 19 ($V_{TP}$ is same as $V_{IN}$).

The group of switching circuits 60 extracts pulse series $V_{TP}$ coming successively from the energy recovery circuit 600, responding to pulse-gating pulses $V_{A1}$ to $V_{A3}$ to obtain townsend pulses $V_{T1}$ to $V_{T3}$. A switching circuit 601 in the group of switching circuit 60 receives the high voltage pulse $V_{TP}$ from the energy recovery circuit 600 through a terminal 62. It receives at the same time the pulse-gating signal on a control line C1 of the pulse-gating signal generating circuit through a terminal 61. Then it performs the control of conduction or cut-off for the high voltage pulse $V_{TP}$ to output the townsend pulse $V_{AT1}$ on an output line A1.

Switching circuit 602 and 603 in the group of switching circuits 60 work in the same way.

Consequently the relevant waveforms indicated in FIG. 19 are applied to the anode electrode A and the cathode electrode K. In this way the selected discharge cells are turned on, responding to the signal applied to the subanode electrode SA and thus it is possible to reproduce the image on the display device.

Since the energy recovery circuit requires an inductor, it is generally difficult to form in an integrated circuit and it is not desirable to dispose an energy recovery circuit for every anode electrode at fabricating the anode driving circuit in the form of an IC. Contrarily thereto, in the case where there are disposed switching circuits according to the present invention, since only one energy recovery circuit is sufficient, an effect is obtained that the anode driving circuit can be fabricated more easily in the form of an IC.

Further, although in the embodiment described above explanation has been made for the case where discharge cells are used as display elements, it is a matter of course that the switching circuit according to the present invention can be used also for driving other display elements, e.g. panels constituted by EL (electroluminescence), liquid crystal, etc., driven by the method, by which pulse voltages are applied time sequentially and intermittently thereto.

Contrarily to the fact that in the above embodiment a switching circuit controlling the conduction and cut-off of the high voltage positive pulse signal has been described, hereinbelow an embodiment of a switch controlling the conduction and cut-off of a high voltage negative pulse signal.

FIG. 20 is a circuit diagram showing an embodiment of the present invention, in which Q2 is an N channel MOS transistor, whose source is connected with the body, and in which the input signal voltage $V_{IN}$ is given to the source side and the output signal voltage $V_{OUT}$ is taken out from the source side. Q1 indicates an N channel MOS transistor, which is used a current drawing-in element, when the transistor Q2 is set forcedly sat the OFF state. D1 is a diode used for protecting the gate of the transistor Q2, by means of which it is possible to set the values of the voltage amplitude of $V_{IN}$ and $V_{OUT}$ below the gate withstand voltage for the transistor Q2. It is desirable that D1 is a Zener diode, whose break down voltage is about 5 to 30 V. R1 is a resistor used for suppressing the intensity of the current flowing through the transistor Q1 and it is unnecessary, in the case where electric power consumption due to the current flowing through the transistor Q1 produces no problem.

FIG. 21 is a time chart showing the method for driving the circuit indicated in FIG. 20. Since there exists a parasitic diode between the drain of the transistor Q2 and the body, in which the drain acts as the cathode ad the body acts as the anode, when the input signal voltage $V_{IN}$ having an amplitude $V_H$ is given thereto, in the high voltage state of $V_{IN}$ the output signal voltage $V_{OUT}$ is also in the high voltage state, independently of the state of the control signal voltage $V_C$. When the input signal voltage $V_{IN}$ falls, if the control signal voltage $V_C$ is in the low voltage state (transistor Q1 is turned off), since the voltage $V_x$ has a tendency to be maintained, the transistor is turned to the ON state and the output signal voltage $V_{OUT}$ also falls. However, when the input signal voltage $V_{IN}$ falls, if the control signal voltage $V_C$ is in the high voltage state (transistor Q1 is turned on), since the transistor Q2 is turned forcedly to the OFF state, the output signal voltage $V_{OUT}$ holds almost the high voltage state. Consequently it is possible to control whether the input signal voltage $V_{IN}$ and the output signal voltage $V_{OUT}$ are made pass-through or cut-off, depending on the value of the control signal voltage $V_C$. In this way it can function as a switching circuit for controlling the falling of output voltage with respect to the input pulse inputted through the input terminal $V_{IN}$.

FIG. 22 is also another time chart showing the method for driving the circuit indicated in FIG. 20. By the present driving method, only during the period of time, where it is not desired to fall the output signal voltage, the control signal voltage $V_C$ is turned to the high voltage state in synchronism with the fall of the input voltage signal $V_{IN}$. In this way a loss current flowing through the transistor Q1 due to the control signal voltage $V_C$ is reduced, which can decrease the electric power consumption of the circuit.

FIG. 23 is a circuit diagram showing another embodiment of the present invention. In the present embodiment a capacity C1 is added between the $V_x$ section and the high voltage power source $V_H$ in the circuit of the embodiment indicated in FIG. 20 so that when the transistor Q1 is in the OFF state and when the input signal voltage $V_{IN}$ falls, the transistor Q2 is more easily turned on. Although in the present embodiment the capacity C1 is located between the $V_x$ section and the high voltage power source, the same effect can be obtained also by locating it between the $V_X$ section and the ground or the $V_C$ section, etc.

Figure 24:
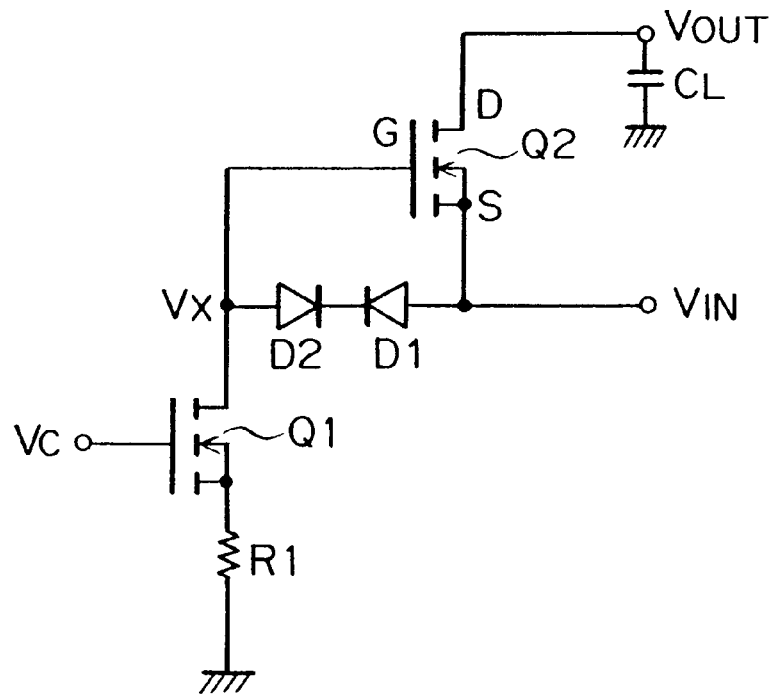

FIG. 24 is a circuit diagram of still another embodiment f the present invention. In the present embodiment a diode D2 is added to the diode D2 in the circuit of the embodiment indicated in FIG. 20, the former being connected in series in the reverse direction with the later. For this reason, even if the driving method indicated in FIG. 21 is used, it is possible to eliminate the loss current flowing through the transistor Q1, when the control signal voltage $V_C$ is in the high voltage state.

Figure 25:
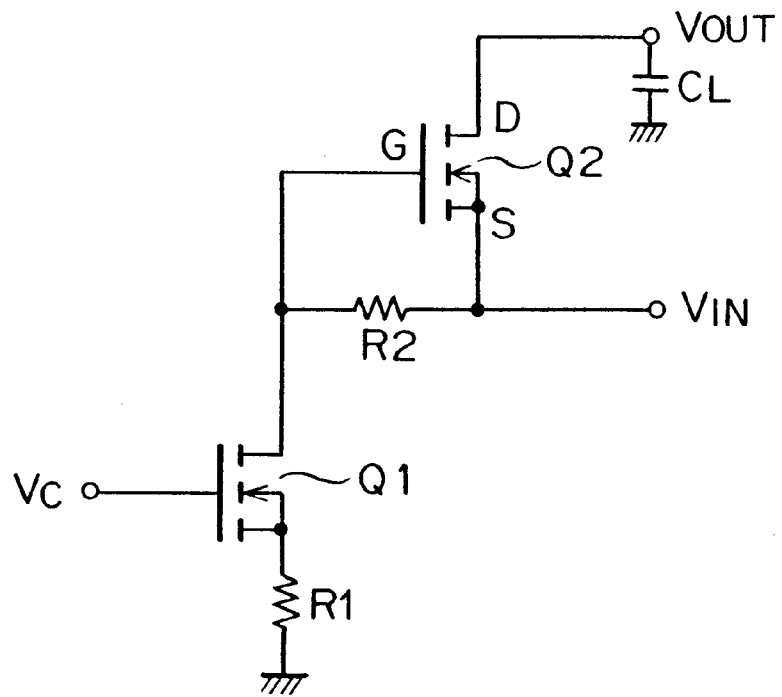

FIG. 25 is a circuit diagram showing still another embodiment of the present invention. In the present invention a resistor R2 is used instead of the diode D1 in the circuit of the embodiment indicated in FIG. 20. For example, in the case where a polycrystalline silicon resistor is used for the resistor R2, it is possible to reduce the occupied area and the parasitic capacity with respect to those of the diode. However, when the resistance of the resistor R2 is too great, it cannot serve as a protection for the gate of the transistor Q2 and on the contrary, when it is too small, it is not possible to turn the transistor to the ON state, when the input signal voltage $V_{IN}$ falls. For this reason attention should be paid to the setting of the resistance.

Figure 26:
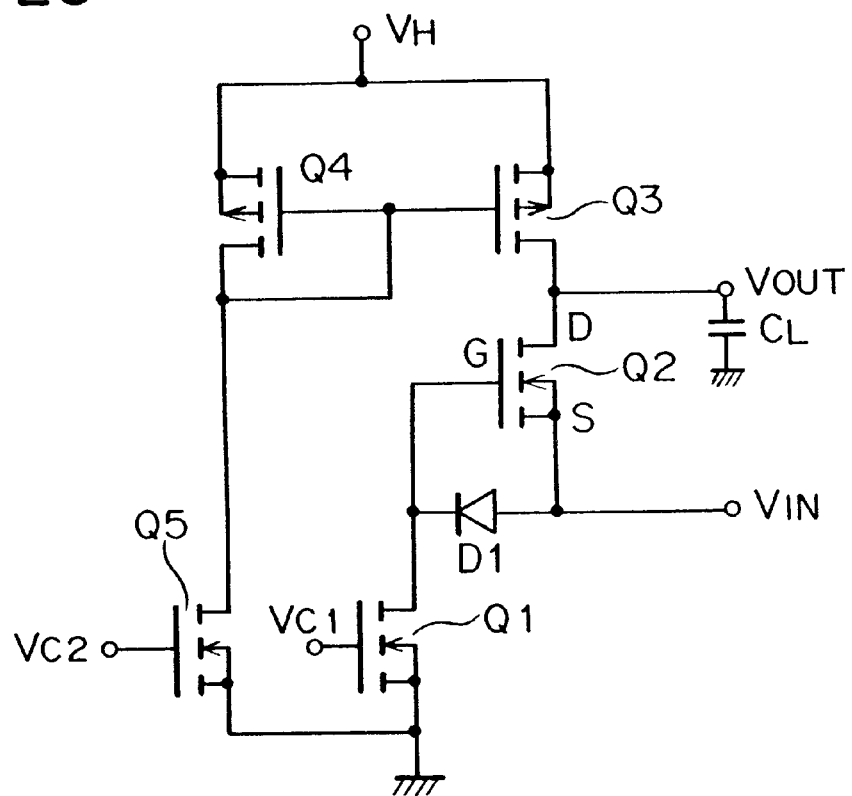

FIG. 26 is a circuit diagram showing still another embodiment of the present invention. Contrarily to the fact that in the embodiment indicated in FIG. 20, etc., even if it is tried to hold the output signal voltage $V_{OUT}$, when the input signal voltage $V_{IN}$ falls, a voltage drop of about 10% of the voltage amplitude of the input signal voltage $V_{IN}$ takes place in the output signal voltage $V_{OUT}$, in the present embodiment two P channel MOS transistors Q3 and Q4 are connected o form a current mirror circuit and the current flowing through the transistor Q3 is controlled by an N channel MOS transistor Q5 in order to prevent this voltage drop and to hold the high voltage state. In order to drive the present circuit, the same driving method as those indicated in FIGS. 21 and 22 can be used, if a first control signal voltage $V_{C1}$ and a second control signal voltage $V_{C2}$ are connected to form the control signal voltage $V_C$.

Figure 27:
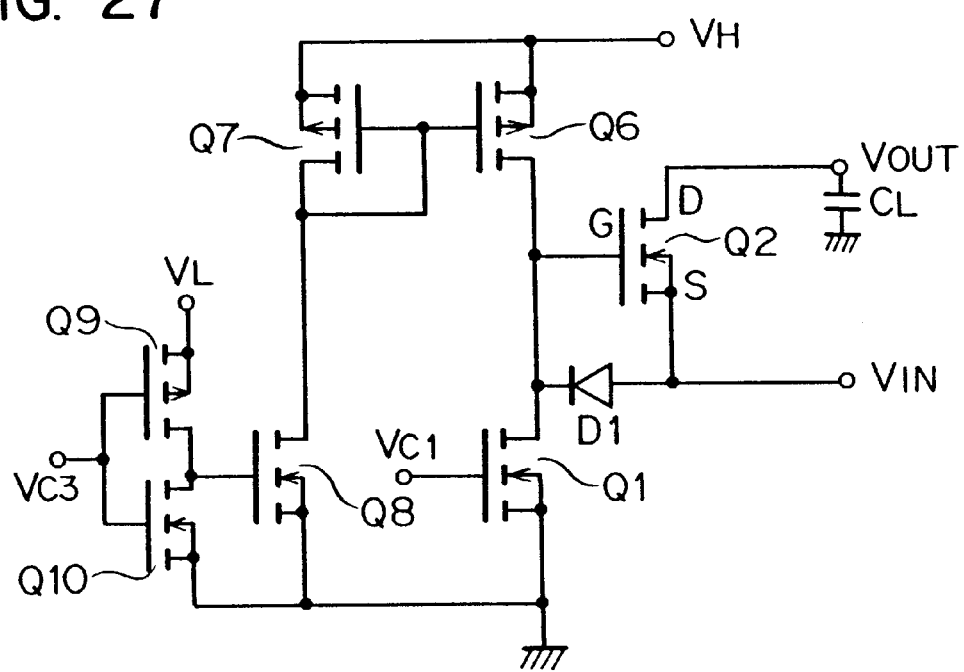

FIG. 27 is a circuit diagram showing still another embodiment of the present invention. In the present embodiment P channel MOS transistors Q6 and Q7 connected to form a current mirror and an N channel MOS transistor Q8 are used as means for supplying current to the gate of the transistor Q2 to set it at the ON state. In the present embodiment, since the output signal voltage can rise in the state where the transistor Q2 is in the ON state, it can be driven without biasing the parasitic diode between the drain of the transistor Q2 and the body in the forward direction. For this reason it is possible to prevent the lowering in the switching speed of the transistor Q2 due to the accumulation of minority carriers. Further, since the transistor Q2 can be set in the ON state, by setting the high voltage power source voltage $V_H$ at a value higher than the maximum voltage $V_{DH}$ of the input signal voltage $V_{IN}$, even if the input signal voltage $V_{IN}$ is in the high state, it is possible to transfer small signals from the input terminal $V_{IN}$ to the output terminal $V_{OUT}$ over a wide voltage range. Further a P channel MOS transistor Q9 and an N channel MOS transistor constitute an inverter and if a first control signal voltage $V_{C1}$ and a third control signal voltage $V_{C3}$ are connected to form the control signal voltage $V_C$, the same driving method as those indicated in FIGS. 21 and 22 can be used.

$V_L$ represents the power source voltage for the signal line.

Figure 28:
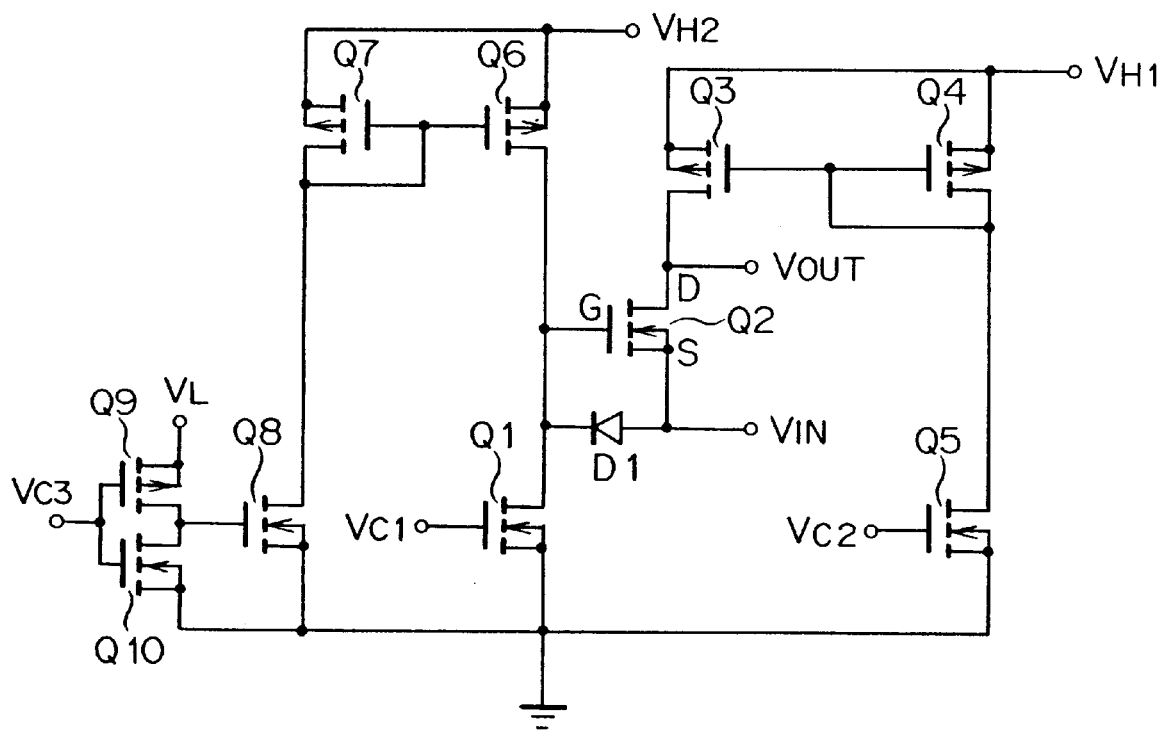

FIG. 28 is a circuit diagram showing still another embodiment of the present invention. The present invention has a structure having the circuit functions indicated in FIGS. 26 and 27. The high voltage power source voltages $V_{H1}$ and $V_{H2}$ may be set at a same level, but by setting one of the high voltage power source voltages $V_{H2}$ at a value higher than the other $V_{H1}$ by about 5 to 20 V, it is possible also to set the transistor Q2 at the ON state, when the input signal voltage $V_{IN}$ is in the high potential level. If three control signal voltages $V_{C1}$, $V_{C2}$, $V_{C3}$ are connected, the same driving method as those indicated in FIGS. 21 and 22 can be used.

Figure 29:
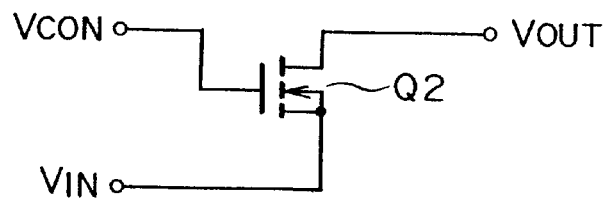
FIG. 29 is a circuit diagram showing the construction of a switch for a negative pulse for a low voltage pulse.

FIG. 29 is a circuit diagram showing still another embodiment of the present invention. The present embodiment is a switching circuit useful, in the case where both the input signal voltage $V_{IN}$ and the output signal voltage $V_{OUT}$ are used at levels below the gate withstand voltage.

Figures 30, 31, 32:
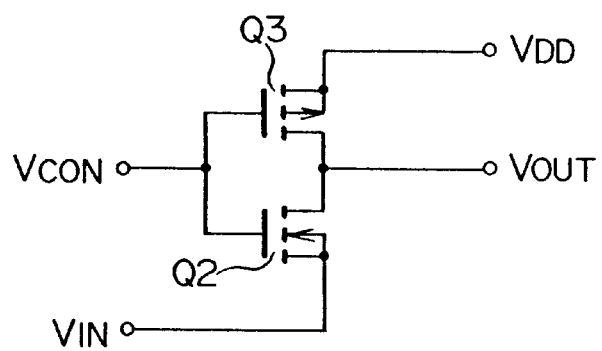
FIG. 30 is a truth-false table showing the operation of the circuit indicated in FIG. 29.
FIG. 31 is a circuit diagram showing another embodiment of the present invention.
FIG. 32 is a truth-false table showing the operation of the circuit indicated in FIG. 31.

FIG. 30 is a truth-false table for the circuit indicated in FIG. 29. In the case where both the control signal voltage $V_C$ and the input signal voltage $V_{IN}$ are in the low voltage state, the output signal voltage $V_{OUT}$ holds the state of the preceding output signal voltage $V_{OUT}$.

FIG. 31 is a circuit diagram showing still another embodiment of the present invention. The present embodiment is also a switching circuit useful for the case where both the input signal voltage $V_{IN}$ and the output signal voltage $V_{OUT}$ are used below the gate withstand voltage.

FIG. 32 is a truth-false table for the circuit indicated in FIG. 31. In the case where both the control signal voltage $V_{CON}$ and the input signal voltage $V_{IN}$ are in the low voltage state, since the P channel MOS transistor Q3 is turned on, the output signal voltage $V_{OUT}$ is in the high voltage state.

FIG. 33 is a circuit diagram showing still another embodiment of the present invention. The present embodiment is a switching circuit, in which the N channel MOS transistor Q2 is replaced by an NPN transistor Q2 and a diode $D_{Q1}$, and the N channel MOS transistor Q1 is replaced by an NPN transistor Q1. In this way the circuits described in the above embodiments can realize circuits having the same effects by replacing the MOS transistor Q2 by a bipolar transistor, with which a diode is connected in parallel.

FIG. 34 shows another example of the switch for the negative high voltage input signal. The switching element Q2 is a P channel FET, in which the drain is the input signal terminal and the source is the output terminal. A gate bias is given between the source and the gate and further a diode D1 for the protection against excessive voltage is connected. The circuit for driving the gate of the transistor Q2 is an N channel FET Q1. A resistor R1 for limiting current is connected with the source of the FET Q1. Now the working mode of the circuit indicated in FIG. 34 will be explained, referring to a time chart indicated in FIG. 35. $V_{IN}$ represents a negative high voltage input signal and $V_C$ an input signal for controlling the transistor Q1 indicated in FIG. 34. When the input signal VC is at the "L" level, since the transistor Q1 is turned off, no potential difference is produced between the gate and the source and thus the transistor Q2 is turned off. For this reason, if the voltage of the input signal $V_{IN}$ varies, the output signal $V_{OUT}$ is kept in the high potential state. On the other hand, when the control signal $V_C$ is at "H" level, the transistor Q1 is turned on. For this reason the gate voltage of the transistor Q2 falls, and a voltage is applied between the gate and the source. In this way the transistor Q2 is turned to the ON state and a negative high voltage pulse is produced in the output signal $V_{OUT}$, as indicated in FIG. 35. Here the diode D1 acts as a protection diode between the gate and the source of the transistor Q2. The connection of the two diodes D1 and D2 in series indicated in FIG. 24, the connection of the resistor R2 indicated in FIG. 25, the addition of the function of holding the output voltage indicated in FIG. 26, etc. can be applied to the circuit indicated in FIG. 34, as they are and are included in the present invention.

Figure 36:
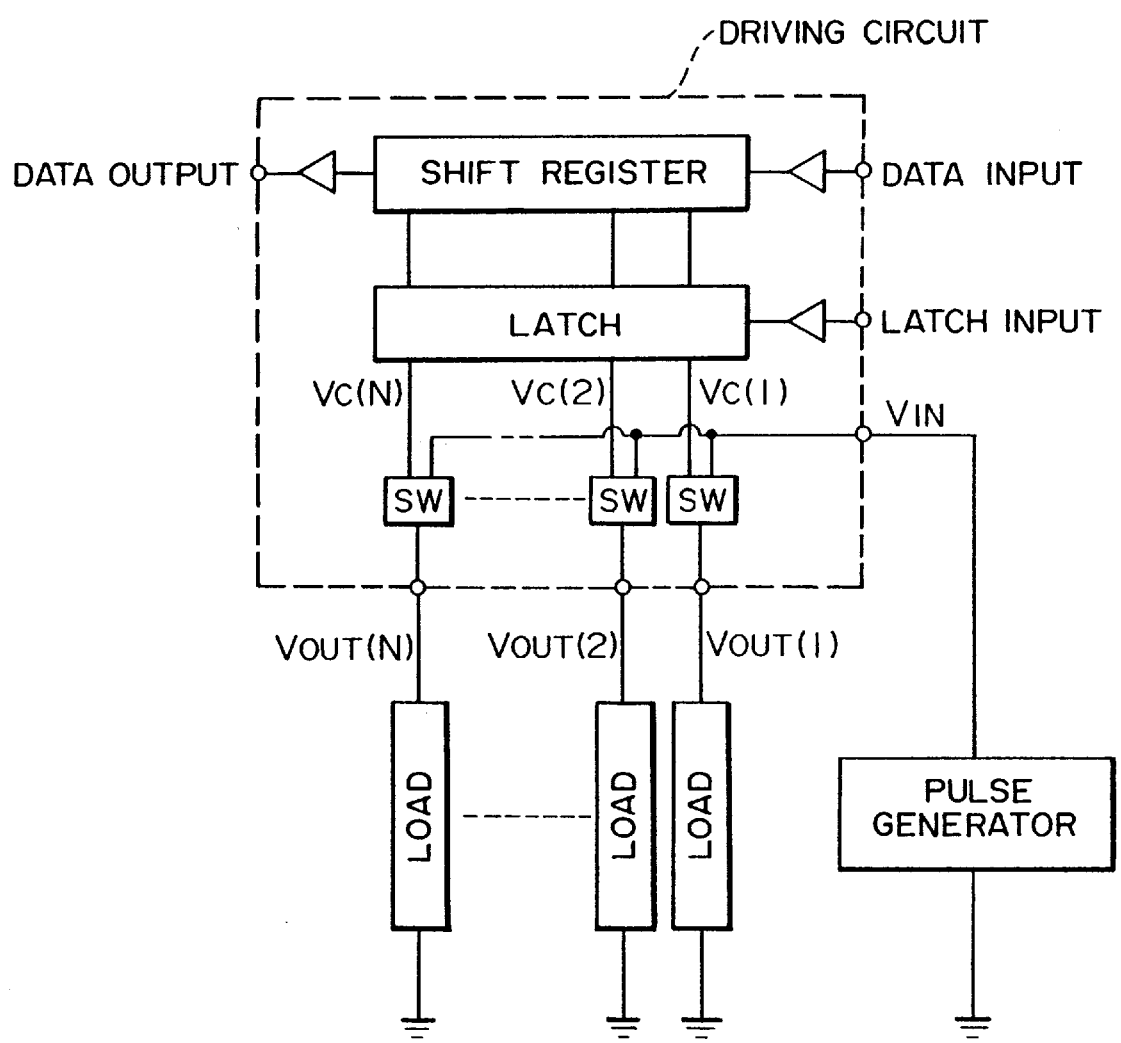
FIG. 36 is a block diagram illustrating a circuit construction using the circuit indicated in FIG. 20.

FIG. 36 is a block circuit diagram illustrating an embodiment of the circuit construction according to the present invention. The present embodiment is so constructed that it is determined by a switching circuit SW opened or closed according to the present invention whether a pulse outputted by a pulse generator should be transmitted to each of more than 2 loads. The opening and shutting of the switching circuit is effected on the basis of control signal voltages VC(1), VC(2), - - - , VC(N) transmitted by a driving circuit. The driving circuit transfers data inputted through a data input terminal in a shift register by using a clock signal to subject them to a serial-parallel transformation and carries out a function to transmit them simultaneously to different switching circuits as the control signal voltage while synchronizing them by means of a latch signal.

In addition, in the circuit indicated in FIG. 36, in the case where the loads are capacitive, the pulse generating circuit can be realized by using an energy recovery circuit (JP-A-61-132997). In this case the electric power transferred from the pulse generator to the lods is returned again from the loads to the pulse generator. In this way a capacitive load driving device of low electric power consumption can be realized.

Figure 37:
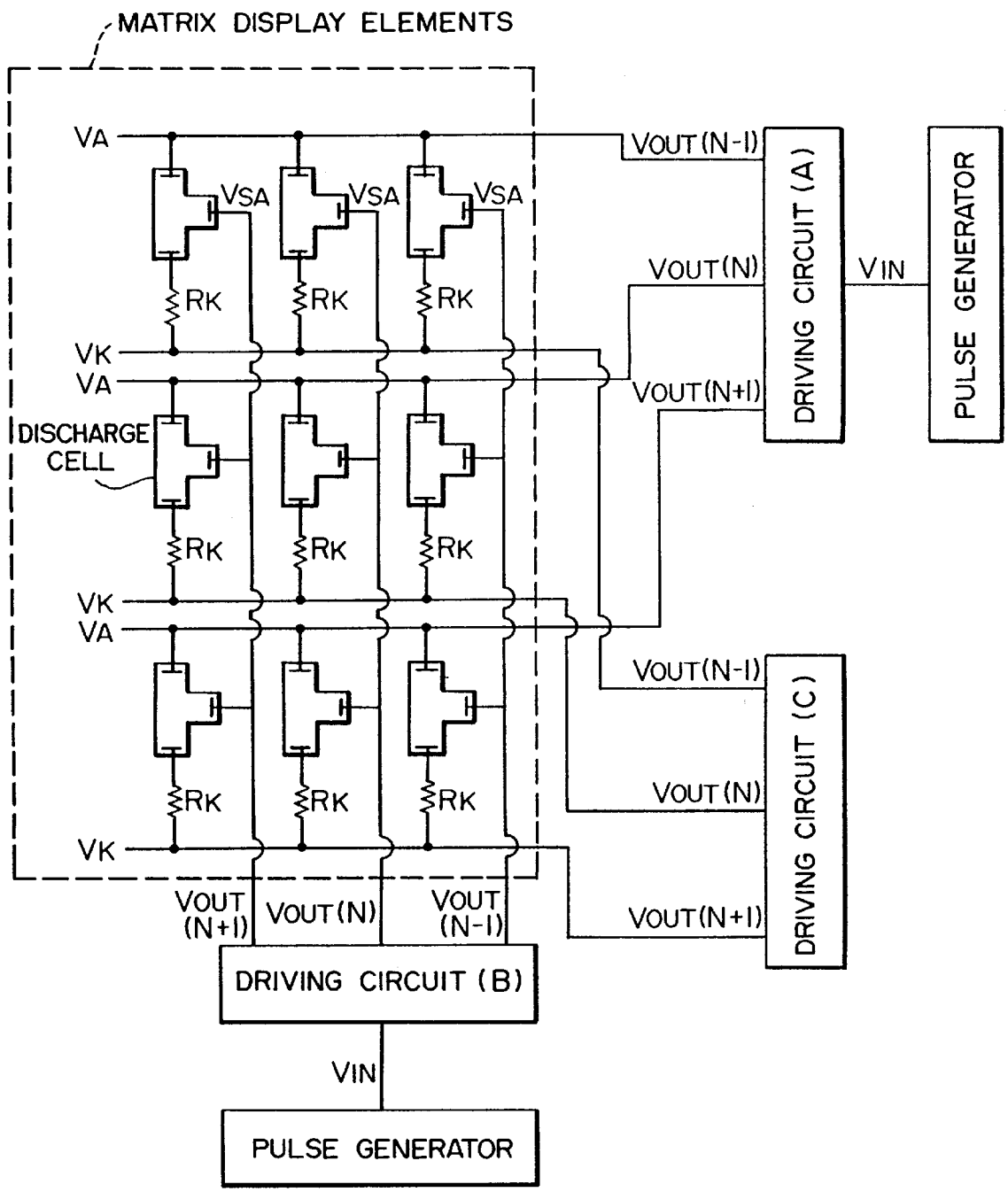
FIG. 37 is a block diagram illustrating a circuit construction, when the present invention is applied to a matrix panel.

FIG. 37 is a circuit block diagram showing an embodiment, in which the present invention is applied to matrix display elements. The present embodiment shows an example, in which a method for driving a matrix display device using switching circuits according to the present invention is used for driving the display device described in Japanese patent application No. 50-113686 as an example.

As indicated in FIG. 37, a discharge cell consists of three electrodes, i.e. an anode, a cathode and an auxiliary anode. While discharge between the anode and the cathode is a display discharge, discharge between the auxiliary anode and the cathode is an auxiliary discharge, which is not observed from the exterior. A cathode resistor $R_K$ is disposed, in order to prevent that the display discharge and the auxiliary discharge take place simultaneously. Denoting the anode voltage by $V_A$, the cathode voltage by $V_K$ and the auxiliary anode voltage by $V_{SA}$, in order to give rise to the display discharge, the following procedure is necessary. That is, (1) start the auxiliary discharge by setting the auxiliary anode voltage $V_{SA}$ at the high level and the cathode voltage $V_K$ at the low level, and then
(2) stop the auxiliary to start the display discharge by setting the auxiliary anode voltage $V_{SA}$ at the low level, the cathode voltage $V_K$ at the low level and the anode voltage at the high level.

When in step (2) the auxiliary anode voltage $V_{SA}$ remains at the high level, even if the cathode voltage $V_K$ remains at the low level and the anode voltage $V_A$ is turned to the high level, the auxiliary discharge is not stopped and the display discharge cannot be started.

Utilizing the feature described above of the discharge cell, it is possible to make an arbitrary discharge cell on a display matrix perform the display discharge by using a positive pulse for the anode voltage $V_A$ and a negative pulse for the cathode voltage $V_K$ as the scan signal and a negative pulse for the auxiliary anode voltage $V_{SA}$ as the image signal. In the case of the present embodiment it is possible to reduce the electric pulse consumption in the anode driving circuit and the auxiliary anode circuit with respect to that required according to the prior art technique. A driving circuit (A) incorporating positive pulse switching circuits as indicated in FIG. 1 is used as the switching circuit for the anode driving circuit; a driving circuit (B) incorporating negative pulse switching circuits as indicated in FIG. 20 is used as the switching circuit for the auxiliary anode driving circuit; and a prior art push-pull type driving circuit (C) is used for driving the cathode. In this way it is possible to realize a display device permitting low electric power consumption drive. Further the driving method described in the present embodiment can be applied to general capacitive load driving devices such as plasma displays, EL (electroluminescence) displays, vacuum fluorescent displays, piezo electric devices, etc.

Figure 38:
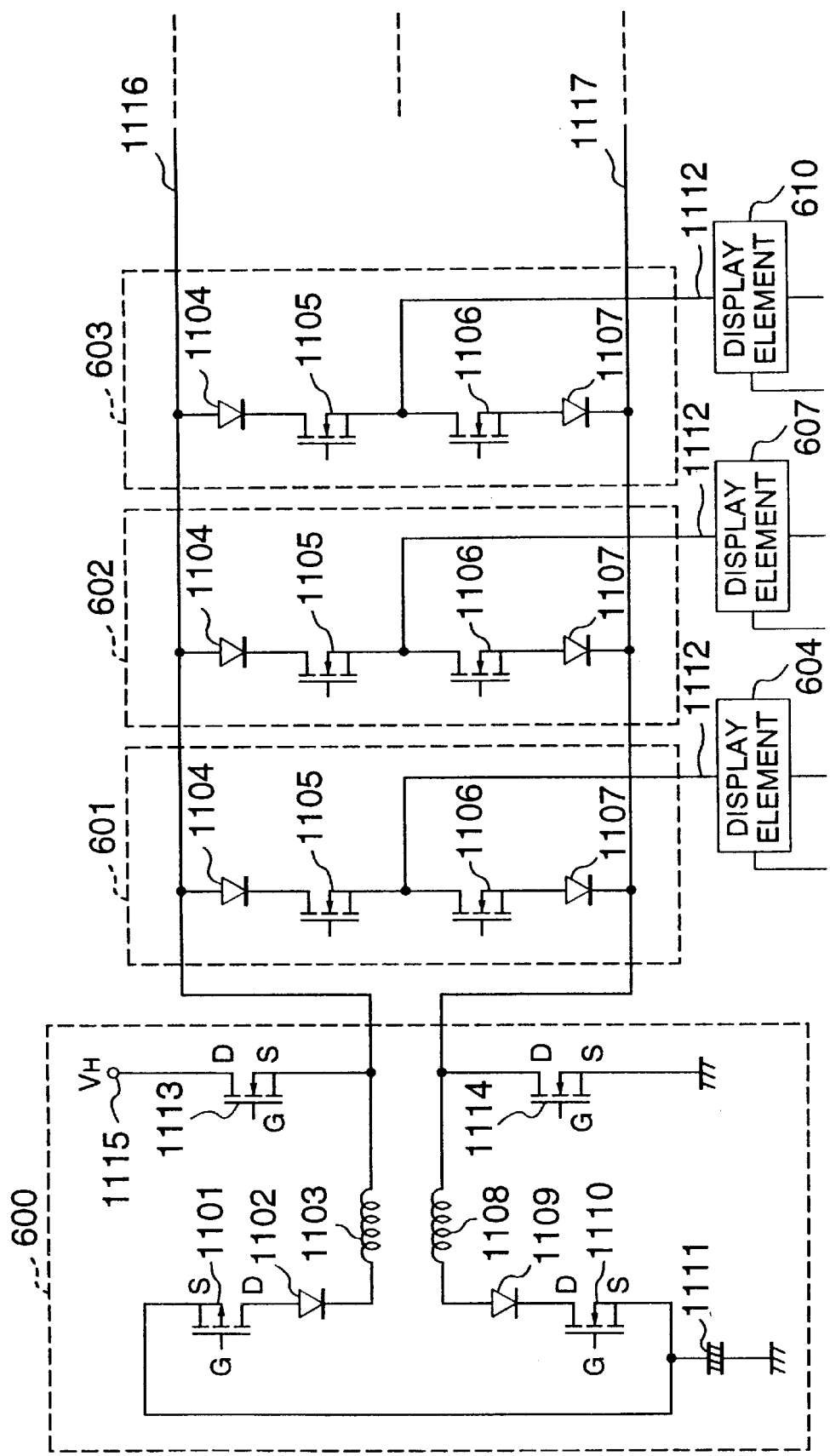
FIG. 38 is a diagram showing a circuit construction indicating an example of circuits using unidirectional switches according to the present invention.
Figure 39:
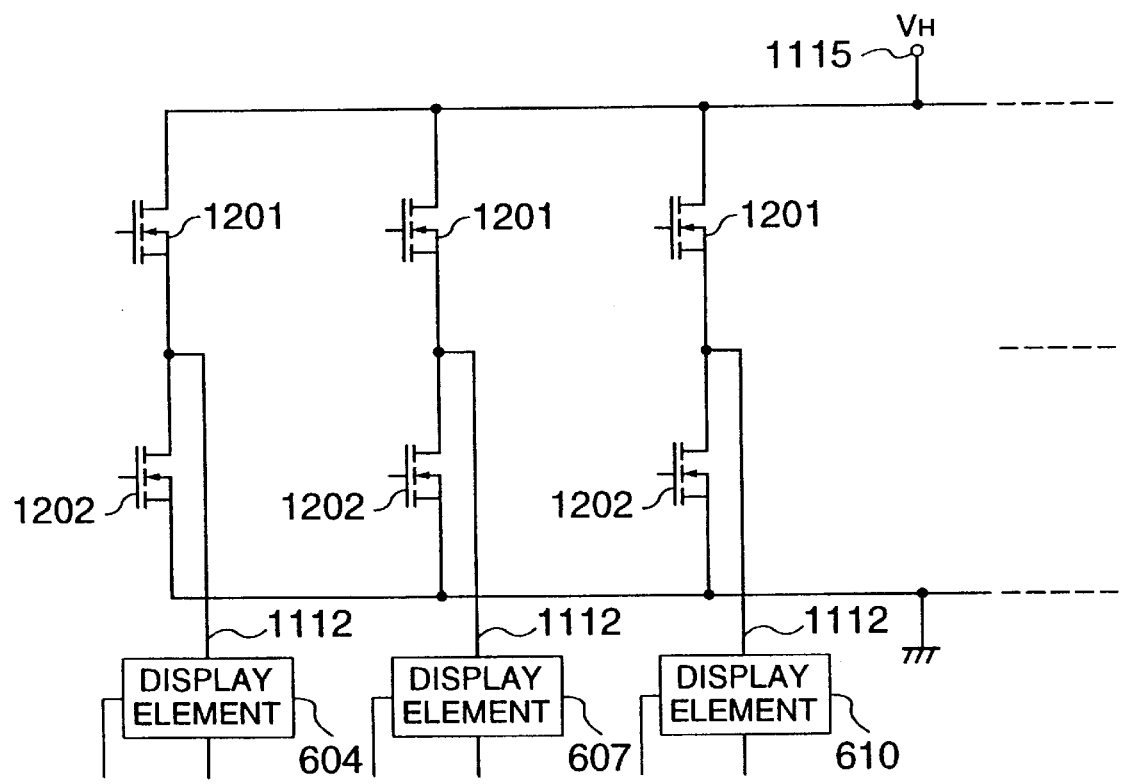
FIG. 39 is a diagram showing a prior art circuit construction.

FIG. 38 is a diagram showing an example of the circuit for driving a plurality of electrodes according to the present invention, in which switching circuits are inserted between an energy recovery circuit and the electrodes, charging and discharging energy being recovered through these switching circuits.

At first a switching circuit 1101, a diode 1102, and an inductance element 1103 are connected in series to a power supply or a charge supplying source 1111 which is formed by a capacitive element storing charges therein. This series circuit plays a role for supplying charges to the electrodes (producing voltage rise at the electrodes). The output terminal 1116 of the inductance element is connected with first unidirectional switches, i.e. series circuits, each of which consists of a diode 1104 and an FET 1105, corresponding to a plurality of electrodes 1112 of display elements 604, 607, 610 . . . , respectively. The output terminal 1116 of the inductance element 1103 is connected further with a switching circuit 1113 for holding the terminal voltage at the level of a high voltage power supply 1115. The output of each of these first unidirectional switches (diode 1104 and FET 1105) is connected e.g. with one of the plurality of address electrodes 1112 of an AC type plasma display.

On the other hand, a circuit for recovering electric charge stored at the electrodes 1112 is formed in a manner that the output terminal 1117 of a series circuit of a switching circuit 1110, a diode 1109 and an inductance element 1109, which is connected with the charge supplying source 1111, is connected with second unidirectional switches, i.e. series circuits, each of which consists of an FET 1106 and a diode 1107. Here the output terminal 1117 of the inductance element 1108 is connected also with a switching circuit 1114 for holding the terminal voltage at the level of a low voltage power supply (here ground level). The output of each of these second unidirectional switches (FET 1106 and diode 1107) is connected with one of the electrodes 1112 (here address electrodes 1112 of the AC type plasma display).

Now current path for charging and discharging the electrodes of the display elements will be explained, using FIG. 38.

At first, the current path, when the electrodes are being charged, will be explained. Now it is supposed that one of the plurality of electrodes is at the low level (ground level). In this case, the output terminal 1116 falls instantaneously to the low level by switching-on the FET 1105 corresponding thereto. Next, when the switch circuit 1101 is turned on, charge stored in the charge supplying source 1111 is transferred into the unidirectional switches (diodes 1104 and FETs 1105) through the switching circuit 1101, the diode 1102 and the inductance element 1103, by which the electrodes 1112 of the display elements 604, 607, 610 are charged. According to the principle of the energy recovery circuit, the voltage of the charge supplying source 1111 is equal to a half of that of the high voltage power supply VH, and the voltage rise reaches the high voltage level VH from the ground level owing to resonance of the inductance element 1103 and the electrodes serving as a capacitive load. As described above, when the electrodes are being charged, electric charges flow from the charge supplying source 1111 into the electrodes 1112 through the inductance element 1103 and the first unidirectional switches (diodes 1104 and FETs 1105). When the voltage at the output terminal of the inductance element 1103 is raised up to the high voltage level VH, the circuit 1113 for holding the terminal voltage at the level of the high voltage power supply is switched-on and holds the voltage of the terminal 1116 at the high voltage level VH.

When some of the electrodes are not to be charged, the FETs 1105 corresponding thereto are switched-off. Since these first unidirectional switches include the diodes 1104, there is no reverse current from the electrodes 1112 to the terminal 1116.

Next the current path, when electric charge stored in the electrodes 1112 of the display elements is released, will be explained. Now it is supposed that some of the plurality of the electrodes are at the high voltage level (voltage level VH). At this time, when the FETs 1106 corresponding thereto are switched-on, current flows into the terminal 1117 through the FETs 1106 and the diodes 1107 and the voltage at the terminal 1117 reaches instantaneously the high voltage level VH.

Then, when the switching circuit 1110 is switched-on, electric charge stored in the electrodes 1112 flows into the charge supplying source 1111 through the FETs 1106, the diodes 1107, the inductance element 1108, the diode 1109, and the switching circuit 1110. The voltage of the electrodes 1112 is lowered to the low voltage level (ground level) owing to resonance of the inductance element 1108 and the electrodes which are capacitive loads. At this time, the circuit 1114 for holding the electrodes at the low voltage level is turned on to thereby hold the voltage thereof at the low voltage level. In this way, electric charge stored in the electrodes is recovered in the charge supplying source 1111 through the second unidirectional switch (the FET 1106 and the diode 1107) and the inductance element 1108.

When it is desired that the voltage of the electrodes is held at the high voltage level (VH level), the FETs 1106 are switched-off. Also in this case, since the second unidirectional switch includes the diode 1107, no current flows into the terminal 1117.

Figure 40:
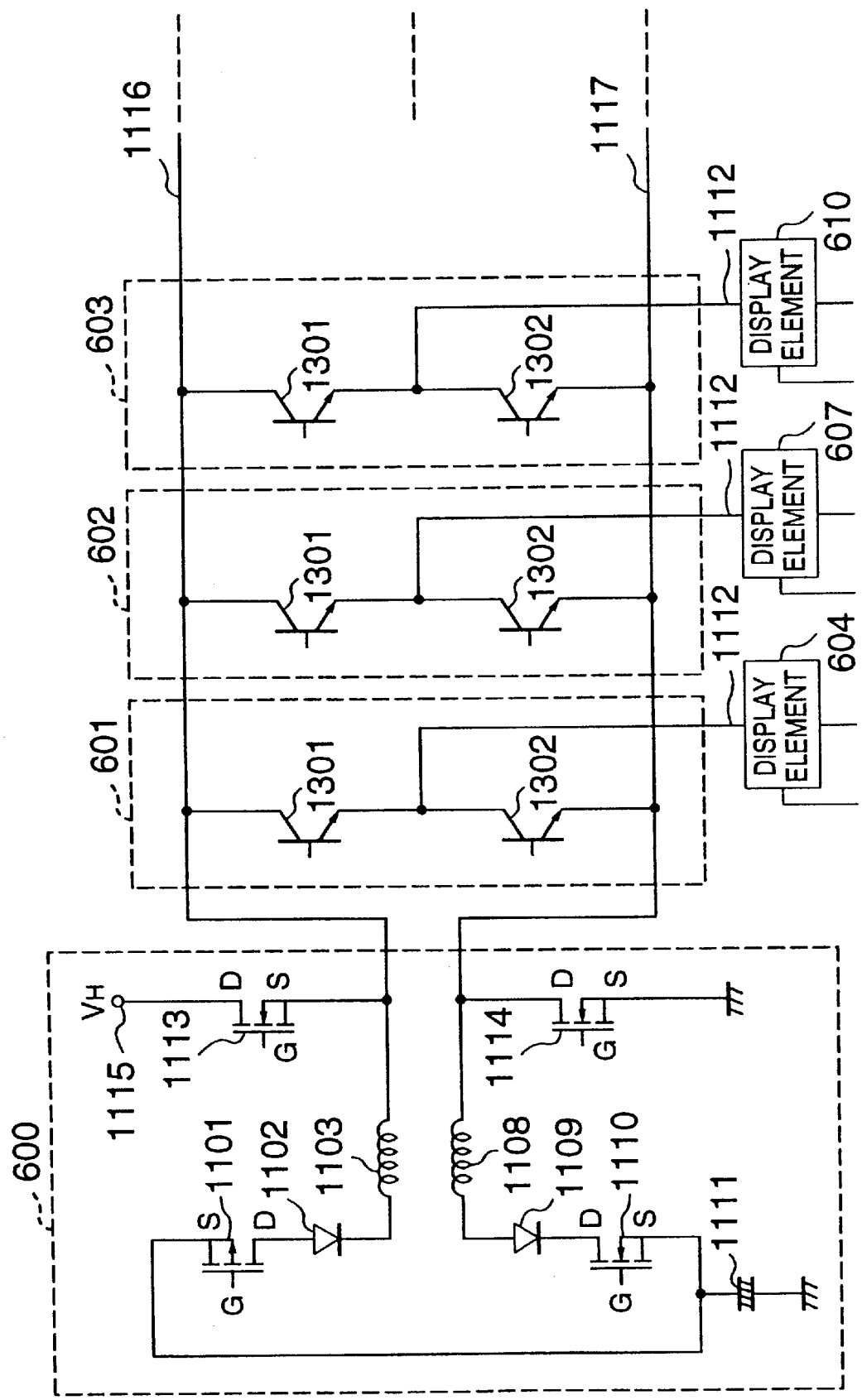
FIG. 40 is a diagram showing a circuit construction indicating an example of circuits, in which bipolar transistors are used, according to the present invention.

Now an example of another embodiment of the present invention is shown by using FIG. 40. FIG. 40 is a circuit diagram, in which the first unidirectional switch and the second unidirectional switch are constructed by using bipolar transistors 1301 and 1302, respectively. Since the FETs 1105 and 1106 have stray diodes, in order to make them unidirectional, the diodes 1104 and 1107 are necessary. On the contrary, since there exist no stray diodes in the bipolar transistors 1301 and 1302, it is possible to realize unidirectional switches by using them only.

Figure 41:
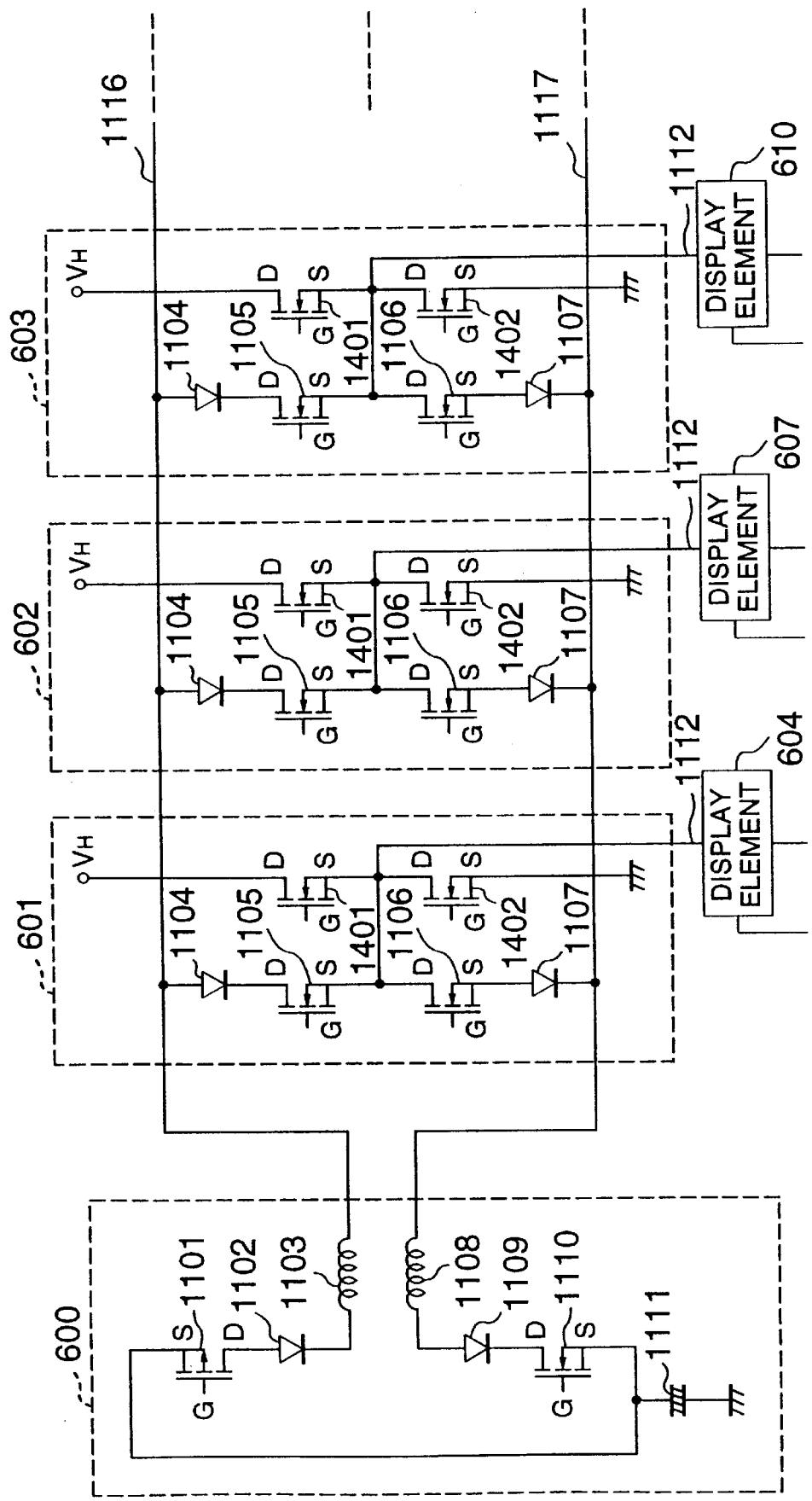
FIG. 41 is a diagram showing a circuit construction indicating an example of circuits, in which voltage hold circuits are disposed at each of the electrodes, according to the present invention.

Next an example of still another embodiment of the present invention is shown by using FIG. 41. FIG. 41 shows a circuit, in which each of the electrodes 1112 of the display elements 604, 607, 610 is connected with voltage hold circuits 1401 and 1402 holding them at the high voltage level VH and the low voltage level (ground level), respectively, and the voltage hold circuits (corresponding to the circuits 1113 and 1114 in FIG. 38) in the energy recovery circuit are removed. In the operation of the circuit indicated in FIG. 38, when the voltage level of the electrodes doesn't vary, either one of the FET 1105 and the FET 1106 remains in the state where it is switched-off. However, as explained with respect to FIG. 38, the voltage level of the terminal 1116 or 1117 is changed instantaneously into the low voltage level or the high voltage level. At this time, since a reverse voltage is applied to the diodes 1104 or 1107, they are not conductive and the electrodes are temporarily placed in a floating state when the voltages of the terminals 1116 and 1117 vary instantaneously. In such a floating state, there may be a case where the voltage of the electrodes varies for some reason. In order to prevent such a variation, in the circuit construction indicated in FIG. 41, the voltage hold circuits 1401 and 1402 are connected with each of the electrodes. In this way, it is possible to drive the electrodes at stable working voltages by holding them at the low voltage level or the high voltage level when the voltage of the electrodes doesn't vary.

Figure 42:
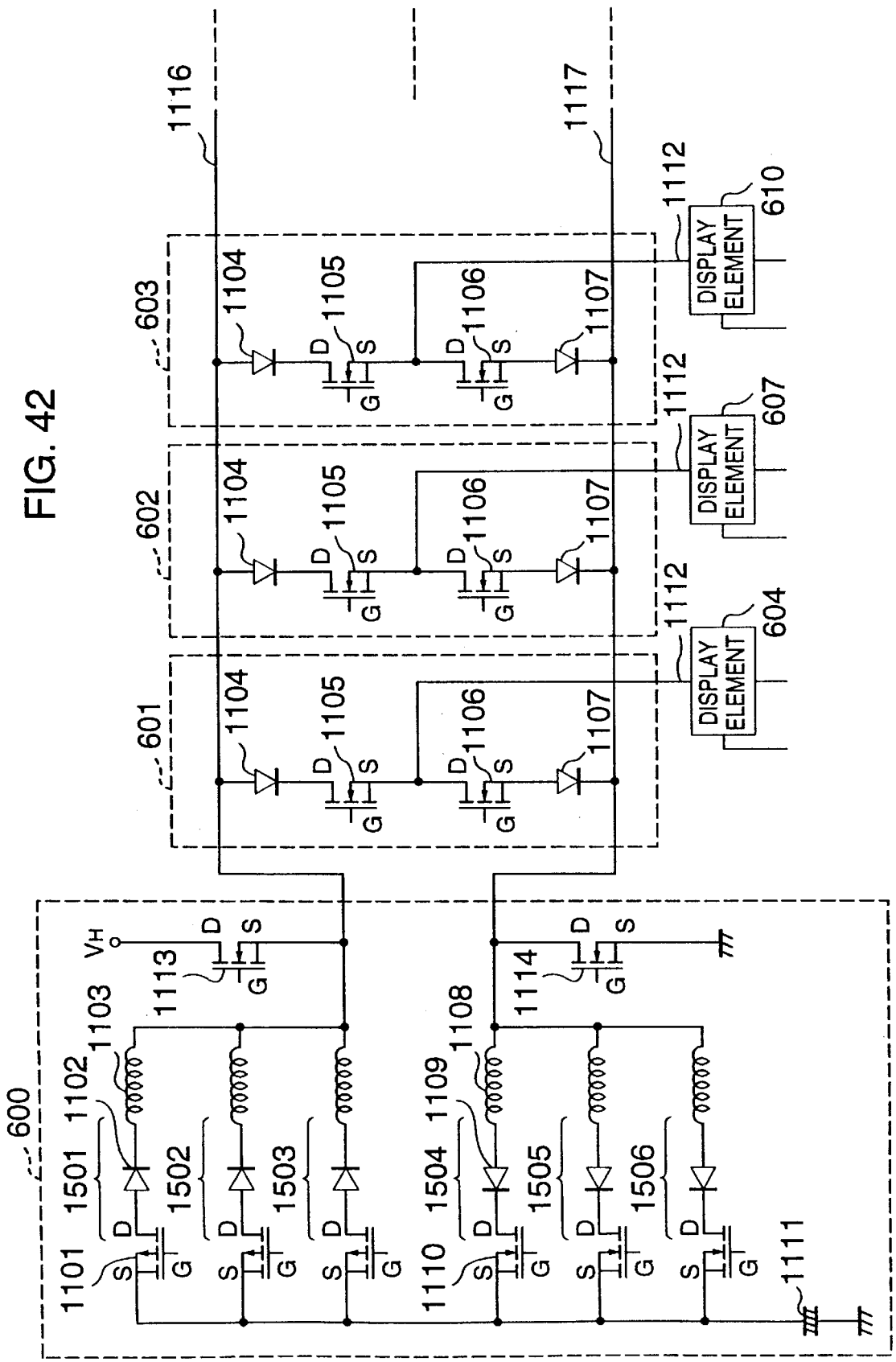
FIG. 42 is a diagram showing a circuit construction indicating an example of circuits for controlling inductance values according to the present invention.

FIG. 42 is a diagram showing an embodiment, in case where the inductance value is controlled according to the present invention. A first unidirectional switch (the diode 1104 and the FET 1105) and a second unidirectional switch (the switching FET 1106 and the diode 1107) are connected with corresponding one of the electrodes. The number of electrodes driven by the energy recovery circuit varies, depending on the number of these first and second unidirectional switches switched-on. Consequently, in this case, load capacitance seen from the energy recovery circuit varies. At that time, the resonance frequency produced by the inductance element and the electrodes varies, and hence the rise time and the fall time of the high voltage pulse applied to the electrodes vary. In such a case, when the present invention is applied to address electrodes of an AC type plasma display, for example, if there are different rise times and fall times of the high voltage pulse, this may cause an erroneous operation. Therefore the number of the first and second unidirectional switches to be switched-on is previously detected and the inductance value of the energy recovery circuit is controlled depending on the detected number thereof. FIG. 42 is a diagram indicating an example of the circuit construction for realizing such a control.

In the circuit indicated in FIG. 42, a plurality of series circuits (in this example three series circuits 1501, 1502, 1503) each formed by a switching circuit 1101, a diode 1102 and an inductance element 1103 are connected in parallel. Further, a plurality of series circuits (in this example three series circuits 1504, 1505, 1506) each formed by a switching circuit 1110, a diode 1109 and an inductance element 1108 are connected in parallel. Here the inductance values of the inductance elements 1103 and 1108 are different among the parallel circuits. For example, if 3 inductance values form a binary system (binery values), it is possible to control the inductance value of the whole circuit in 7 stages by on-off controlling the 3 switching circuits 1101 or 1110. Now, supposing that the total number of the plurality of electrodes 1112 is N, the number of the unidirectional switches switched-on is set at a value closest to a multiple of N/7 and the inductance value is controlled depending thereon. Since the resonance frequency of the inductance element and the electrodes is defined by the root of a product of inductance and capacitance, the value of the product of inductance and capacitance is kept almost constant by varying the inductance value in these 7 stages, in order to keep the resonance frequency almost constant. In this way, even if an arbitrary number of unidirectional switches are switched-on, it is possible to obtain a pulse waveform having almost constant rise and fall time periods of the high voltage pulse by detecting the number of unidirectional switches switched-on and controlling the inductance value of the energy recovery circuit depending on the detected number as described above. Although 3 series circuits, each of which consists of the switching circuit 1101, the diode 1102 and the inductance element 1103, are connected in parallel in the example of FIG. 42, the number of the parallel circuits is determined by a tolerable error region of the rise and fall time periods of the high voltage pulse, and so the number of the parallel circuits is not restricted to 3.

Now an example of the method for controlling the unidirectional switches will be explained by using FIGS. 43 and 44.

Figure 43:
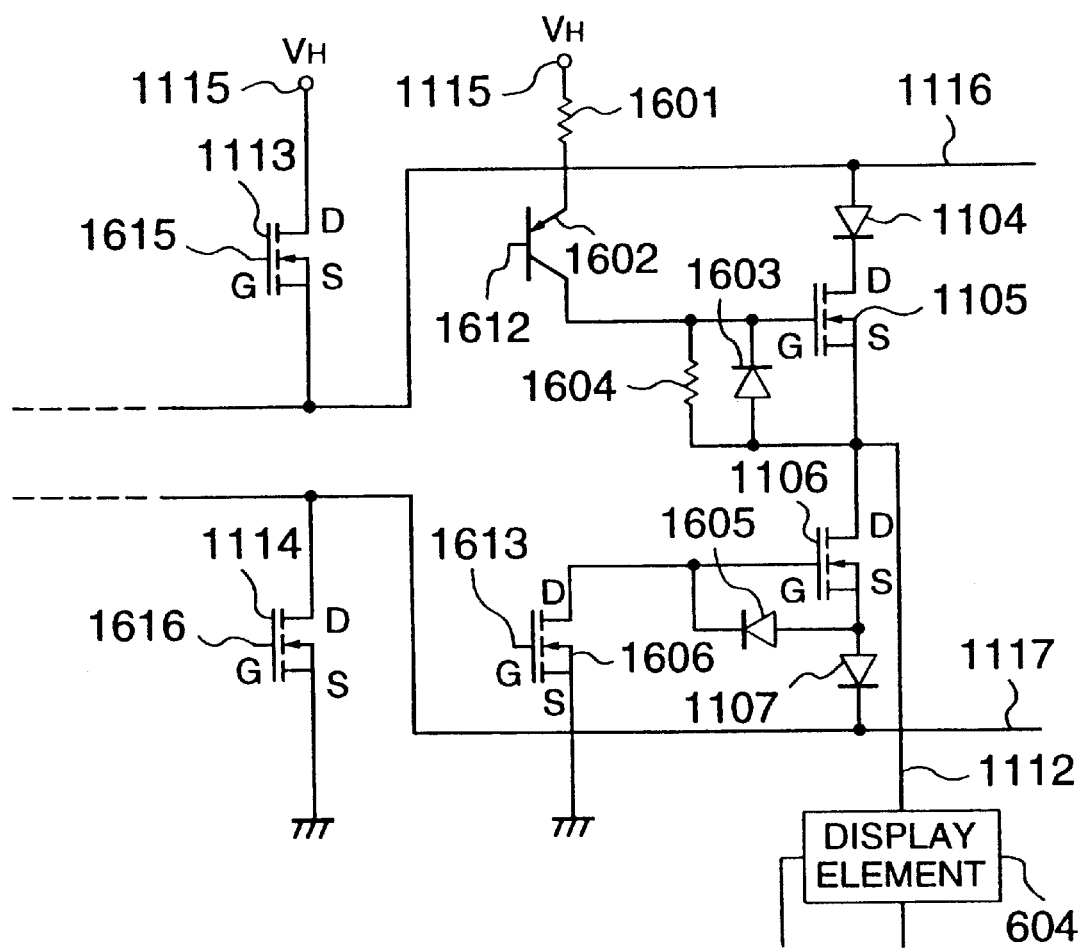
FIG. 43 is a diagram showing a circuit construction indicating an example of control circuits for switching circuits according to the present invention.

FIG. 43 indicates an example of the circuit of a control portion for the FETs 1105 and 1106 in the unidirectional switches. FIG. 43 shows an example in which N channel MOS FETs are used for the FETs 1105 and 1106. A resistor 1604 and a protection diode 1603 are connected between the gate and the source of the FET 1105 and the gate of this FET is driven by a constant current source circuit formed by a resistor 1601 and a PNP transistor 1602. On the other hand, a diode 1605 is connected between the gate and the source of the FET 1106 and the gate of the FET 1106 is driven by an FET 1606.

FIG. 44 shows voltage waveforms at the respective input terminals of the circuit indicated in FIG. 43 and a waveform of the voltage applied to the electrode. (A) of FIG. 44 indicates an input voltage waveform for the first unidirectional switch (voltage waveform at the terminal 1116 in FIG. 43); (B) of FIG. 44 an input voltage waveform for the second uni-directional switch (voltage waveform at the terminal 1117 in FIG. 43); (C) of FIG. 44 a waveform of a signal inputted to the gate 1615 of the voltage hold circuit (1113 in FIG. 43) for holding the terminal 1116 at the level of the high voltage power supply; (D) of FIG. 44 a waveform of a signal inputted to the gate 1616 of the voltage hold circuit (1114 in FIG. 43) for holding the terminal 1117 at the level of the low voltage power supply; (E) of FIG. 44 a waveform of a signal at the base of the PNP transistor 1602 in the constant current source circuit in FIG. 43; (F) of FIG. 44 a waveform of a signal inputted to the gate 1613 of the FET 1606 in FIG. 43; and (G) of FIG. 44 a waveform of the voltage applied to the electrode (1112 in FIG. 43).

Next a method for controlling the circuit indicated in FIG. 43 will be explained by using the input voltage waveform, the different control voltage waveforms, and the output waveform in periods of time from I to XIII in FIG. 44. At first, it is supposed that the electrode 1112 is at the low voltage level in the period of time I. As indicated in (E) of FIG. 44, in the period of time II, the base 1612 of the transistor 1602 in FIG. 43 is turned to the Low state. At this time, the transistor 1602 is switched-on and current flows from the high voltage power supply VH into the gate of the FET 1105 through the resistor 1601 and the transistor 1602. Thus a voltage is produced between the gate and the source of the FET 1105 across the resistor 1604, and the FET 1105 is switched-on. Since the voltage of the electrode 1112 was at the low voltage level in the period of time I and the FET 1105 is switched-on in the period of time II, as indicated in (A) of FIG. 44, the voltage waveform at the input terminal 1116 is instantaneously lowered to the low voltage level in an extremely short part at the beginning of the period of time II. Next, since the energy recovery circuit (switching circuit 1101 in FIG. 38) is switched-on in the period of time II, the voltage at the input terminal 1116 rises in a sinusoidal fashion. Here the voltage at the input terminal (electrode) 1112 rises also in a sinusoidal fashion due to the fact that the diode 1104 and the FET 1105 are switched-on.

On the other hand, as indicated in (F) of FIG. 44, the input signal at the gate 1613 of the FET 1606 is turned to the high state in the period of time II. At this time the FET 1606 is switched-on and the voltage at the gate of the FET 1106 is lowered to the low voltage level. Now, since the voltage waveform at the input terminal 1117 is raised instantaneously to the high voltage level (explained later) and falls thereafter in a sinusoidal fashion, as indicated in (B) of FIG. 44, no voltage is produced between the gate and the source of the FET 1106 and thus the FET 1106 is switched-off due to the fact that the voltage at the gate of the FET 1106 falls also at the same time.

Next, in the period of time III, since the voltage hold circuits 1113 and 1114 are switched-on, the voltage at the input terminal 1116 is held at the high voltage level VH, while the voltage at the input terminal 1117 is held at the low voltage level. Here, in the period of time III, since the FET 1105 is switched-on and the FET 1106 is switched-off, the voltage at the electrode 1112 is at the high voltage level VH.

Next, in the period of time IV, the voltage at the input terminal 1116 is lowered once to the low voltage level as indicated in (A) of FIG. 44, but charge stored in the electrode 1112 flows never reversely into the input terminal 1116 even if the FET 1105 is switched-on due to the fact that a reverse voltage is applied to the diode 1104. Further, although the voltage at the input terminal 1117 is raised once to the high voltage level as indicated in (B) of FIG. 44, but no current flows from the electrode 1112 into the input terminal 1117 due to the fact that the FET 1106 is switched-off. As described above, in the period of time IV, the electrode is in a floating state and since the voltage was at the high voltage level in the period of time III, this voltage of the electrode is maintained in the period of time IV.

The operation in the period of time V is identical to that in the period of time III and the voltage at the electrodes is held at the high voltage level.

Next, in the period of time IV, since the signal at the base 1612 of the transistor 1602 is at the high state as indicated in (E) of FIG. 44, the transistor 1602 is switched-off and no current flows through the gate of the FET 1105. Consequently, since no current flows through the resistor 1604, the voltage at the gate of the FET 1105 is same as that at the source thereof and the FET 1105 is switched-off. Further, in the period of time VI, the signal at the gate 1613 of the FET 1606 is at the Low state as indicated in (F) of FIG. 44. Consequently the FET 1606 is switched-off. Now, when the voltage at the input terminal 1117 is raised to the high voltage level and lowered thereafter in a sinusoidal fashion as indicated in (B) of FIG. 44, the diode 1107 is turned-on. At this time, the voltage at the source of the FET 1106 is lowered also in a sinusoidal fashion. Here a voltage is produced between the gate and the source of the FET 1106 by the diode 1605 and the FET 1106 is switched-on. Consequently charge stored in the electrode 1112, which was at the high voltage level in the period of time V, flows out through the FET 1106 and the diode 1107 in the period of time VI and hence the voltage at the electrode 1112 is lowered in a sinusoidal fashion to the low voltage level.

Next, in the period of time VII, since the FET 1105 is switched-off and the voltage between the gate and the source of the FET 1106 is maintained by the diode 1605, the FET 1106 is kept in an on state and so the voltage of the electrode 1112 is held at the low voltage level.

Since operation in the periods of time IX, X and XI is identical to that explained for the periods of time II, III, VI and VII, explanation thereof will be omitted.

Next, in the period of time XII, the voltage at the input terminal 1116 is once lowered to the low voltage level and raised thereafter in a sinusoidal fashion to the high voltage level. However, since the FET 1105 is switched-off, no current flows into the electrode. Further the voltage at the input terminal 1117 is once raised to the high voltage level and lowered thereafter in a sinusoidal fashion, but since a reverse voltage is applied to the diode 1107, no current flows from the input terminal 1117 into the electrode. Consequently, in this period of time XII, the electrode is in a floating state and since the voltage at the electrode was at the low voltage level in the period of time XI, this low voltage is maintained at the electrode.

Since operation in the period of time XIII is identical to that explained for the period of time VII, explanation thereof will be omitted.

It was stated that the voltages of the input terminals 1116 and 1117 are turned instantaneously to the low voltage level or the high voltage level in the periods of time II, IV, VI, VII, X, and XII. This is because if either one of the first unidirectional switches and the second unidirectional switches connected with a plurality of different electrodes is switched-on, charge stored in the electrodes flows into the input terminal 1116 or 1117. Although no such instantaneous variation is produced when all the unidirectional switches are switched-off, nevertheless a desired voltage can be obtained at the electrodes.

The gate control circuits for the FETs 1105 and 1106 indicated in FIG. 43 stated previously are only an example and the present invention is not restricted to the gate driving circuits indicated in FIG. 43. For example, the gate control circuit may be formed by using level shift circuits, photocouplers, or the like.

As described above, since the width of pulses applied to the electrodes can be controlled arbitrarily, the switch circuit according to the present invention is capable of performing energy recovery with low electric power consumption and with a simple structure.

What is claimed is:

1. A method for driving a display device, by which energy is supplied to a plurality of electrodes serving a capacitive load through a first group of switches and is recovered from said electrodes through a second group of switches, said method comprising the steps of:

charging each of a first number of said electrodes through a first path from a charge supplying source to said each of said first number of electrodes, said first path comprising a first inductance and a corresponding one of said first group of switches; and discharging each of a second number said electrodes through a second path from each of said second number of electrodes to said charge supplying source, said second path comprising a corresponding one of said second group of switches and a second inductance, wherein
    said first and second inductances are distinct from one another, and
    said charging and discharging are effected at substantially a same time.

2. A method for driving a display device according to claim 1, further comprising the steps of detecting said first number of electrodes for charging and detecting said second number of electrodes for discharging, and controlling an inductance value for each of said first and second paths depending on the detected first and second numbers.

3. A circuit for driving a display device having a plurality of electrodes for display elements serving as a capacitive load, said driving circuit comprising:

a charging supply source comprising one of a power supply and a charged capacitor;

a first series circuit including a first switch, a first diode and a first inductance element, said first series circuit being connected, at a first terminal, with said charging supply source, and being connected, at an output terminal, with at least two of said electrodes through at least two corresponding first unidirectional switches so that, when said at least two electrodes are being charged, said first switch, said first diode and said corresponding first unidirectional switches are made conductive; and a second series circuit including a second switch, a second diode and a second inductance element, said second series circuit being connected, at a first terminal, with said charging supply source, and being connected, at an output terminal, with at least two of said electrodes through at least two corresponding second unidirectional switches so that, when said at least two electrodes are being charged, said second switch, said second diode and said corresponding second unidirectional switches are made conductive, wherein
    said first and second inductances are distinct from one another.

4. A circuit for driving a display device according to claim 3, wherein an output terminal of said first inductance element is connected with a switching circuit for holding said output terminal of said first inductance element at a level of a high voltage power supply, and an output terminal of said second inductance element is connected with a switching circuit for holding said output terminal of said second inductance element at a level of a low voltage power supply.

5. A circuit for driving a display device according to claim 3, wherein each of said first and said second unidirectional switches is formed by a series circuit of a diode and an FET.

6. A circuit for driving a display device according to claim 3, wherein each of said first and said second unidirectional switches is formed by a bipolar transistor circuit.

7. A circuit for driving a display device according to claim 3, wherein a plurality of said first series circuits, each of which includes said first switching circuit, said first diode, and said first inductance elements, are connected in parallel, inductance values of said plurality of first inductance elements forming a binary system, and a plurality of said second series circuits, each of which include said second switching circuit, said second diode, and said second inductance elements, are connected in parallel, inductance values of said plurality of second inductance elements forming a binary system.

8. A circuit for driving a display device according to claim 3, wherein each of said plurality of electrodes is connected with a voltage hold circuit for holding levels of said electrodes at a level of said high voltage power supply and a voltage hold circuit for holding levels of said electrodes at a level of said low voltage power supply.

9. A circuit for driving a display device according to claim 3, wherein said electrodes of said plurality of display elements are address electrodes of an AC type plasma display.

10. A display apparatus having a display device which has a plurality electrodes for display elements serving as a capacitive load, in which switches are inserted between an energy recovery circuit and said electrodes, and a driving circuit for driving said display, said driving circuit comprising:

a charging supply source;

a first series circuit including a first switch, a first diode and a first inductor, said first series circuit being connected to said charging supply source, and being connected at an output terminal thereof, to a first number of said electrodes through a corresponding number of first unidirectional switches such that, when at least one of said first number of electrodes is charged, said first switch, said first diode and said first unidirectional switches are made conductive; and a second series circuits including a second switch, a second diode and a second inductor, said second series circuit being connected to said charging supply source, and being connected at an output terminal thereof, to a second number of said electrodes through a corresponding number of second unidirectional switches such that, when at least one of said second number of electrodes is discharged, said second switch, said second diode and said second unidirectional switches are made conductive, wherein said first and second inductors are distinct from one another.

11. A display apparatus according to claim 10, wherein an output terminal of said first inductor is connected with a first switching circuit for holding said output terminal of said first inductor at a level of a high voltage power supply, and an output terminal of said second inductor is connected with a second switching circuit for holding said output terminal of said second inductor at a level of a low voltage power supply.

12. A display apparatus according to claim 10, wherein each of said first and said second unidirectional switches comprises a series circuit having a diode and a FET.

13. A display apparatus according to claim 10, wherein each of said first and said second unidirectional switches comprises a bipolar transistor.

14. A display apparatus according to claim 10, comprising a plurality of said first series circuits, each of which includes a first switch, a first diode, and a first inductor, are connected in parallel, inductance values of said plurality of first inductors forming a binary system, and a plurality of said second series circuits, each of which includes a second switch, a second diode, and a second inductor, are connected in parallel, inductance values of said plurality of second inductors forming a binary system.

15. A display apparatus according to claim 10, further comprising a first voltage hold circuit connected to each of said electrodes, said first voltage hold circuit arranged to hold said each of said electrodes at a high voltage power supply level; and a second voltage hold circuit connected to each of said electrodes, said second voltage hold circuit arranged to hold said each of said electrodes at a low voltage power supply level.

16. A display apparatus according to claim 10, wherein said electrodes of said plurality of display elements are address electrodes of an AC type plasma display.

17. A driving circuit for a display device, in which energy is supplied to a plurality of electrodes serving as capacitive loads through a first group of switches and recovered from said plurality of electrodes through a second group of switches, respectively, said driving circuit comprising:

said first group of switches each coupled to corresponding one of said plurality of electrodes;

said second group of switches each coupled to corresponding one of said plurality of electrodes;

a first path including a first inductance, said first path having a first end coupled to a charge supplying source and a second end coupled to said plurality of electrodes though said first group of switches; and a second path including a second inductance, said second path having a first end coupled to said charge supplying source and a second end coupled to said plurality of electrodes though said second group of switches, wherein current for charging each of said plurality of electrodes is arranged to flow from said charge supplying source through said first path and said corresponding one of said first group of switches, and current for discharging each of said plurality of electrodes is arranged to flow from said each of said plurality of electrodes to said charge supplying source through said second path and said corresponding one of said second group of switches, and wherein charging a first number of said plurality of electrodes and discharging a second number of said plurality of electrodes are effected at substantially a same time.

18. A driving circuit for a display device according to claim 17, further comprising means for detecting a first number of electrodes to be charged and a second number of electrodes to be discharged at substantially a same time; and means for controlling a value of said inductance in each of said first and second paths in accordance with the detected first and second numbers.

19. A driving circuit for a display device according to claim 17, wherein each of said first and second groups of switches comprise unidirectional switches.

20. A display apparatus comprising:

a charge supplying source having a first charging terminal;

a first series circuit comprising a first switch, a first diode and a first inductor arranged in series, said first switch being connected to said first terminal, and said first inductor being connected to a first output terminal, wherein said first diode is arranged to allow current to flow in direction from said first switch to said first inductor;

a second series circuit comprising a second switch, a second diode and a second inductor arranged in series, said second switch being connected to said first charging terminal, and said second inductor being connected to a second output terminal, wherein said second diode is arranged to allow a current to flow in a direction from said second inductor to said second switch, said first and second inductors being distinct from one another;

a plurality of display elements, each of said plurality of display elements having a first electrode connected to corresponding first and second unidirectional switches, said first and second unidirectional switches being connected in series between said first output terminal and said second output terminal;

said first unidirectional switch having a first end connected to said first output terminal and a second end connected to said first electrode and also to a first end of said second unidirectional switch, said first unidirectional switch being arranged to selectively permit a current to flow between said first output terminal and said corresponding display element; and said second unidirectional switch being connected at its first end to said first electrode and having a second end connected to said second output terminal, said second unidirectional switch being arranged to selectively permit a current to flow between its corresponding display element and said second output terminal.

21. The display apparatus of claim 20, wherein each of said first and second unidirectional switches comprise one of: a bipolar transistor, and a field-effect transistor connected in series with a diode.

22. The display apparatus of claim 20, further comprising:

a first switching circuit connected to said first output terminal, said first switching circuit arranged to maintain said first output terminal at a high voltage level; and a second switching circuit connected to said second output terminal, said second switching circuit arranged to maintain said second output terminal at a low voltage level.

23. The display apparatus of claim 20, further comprising:

a first voltage hold circuit connected to said first electrode, said first voltage hold circuit arranged to selectively maintain a voltage of said first electrode at a high voltage level;

a second voltage hold circuit also connected to said first electrode, said second voltage hold circuit arranged to selectively maintain a voltage of said first electrode at a low voltage level.

24. The display apparatus of claim 20 comprising:

a plurality of said first series circuits, each of which is connected between said first charging terminal and said first output terminal; and a plurality of said second series circuits, each of which is connected between said first charging terminal and said second output terminal.

25. The display apparatus of claim 24, further comprising:

a first switching circuit connected to said first output terminal, said first switching circuit arranged to maintain said first output terminal at a high voltage level; and a second switching circuit connected to said second output terminal, said second switching circuit arranged to maintain said second output terminal at a low voltage level.

\* \* \* \* \*